(12) United States Patent
Song et al.

(10) Patent No.: US 11,222,949 B2
(45) Date of Patent: Jan. 11, 2022

(54) SEMICONDUCTOR DEVICES AND METHODS OF MANUFACTURING THE SAME

(71) Applicant: Samsung Electronics Co., Ltd., Suwon-si (KR)

(72) Inventors: Seung-Min Song, Hwaseong-si (KR); Woo-Seok Park, Ansan-si (KR); Jung-Gil Yang, Hwaseong-si (KR); Geum-Jong Bae, Suwon-si (KR); Dong-Il Bae, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/996,334

(22) Filed: Aug. 18, 2020

(65) Prior Publication Data

US 2020/0381514 A1 Dec. 3, 2020

Related U.S. Application Data

(63) Continuation of application No. 16/052,091, filed on Aug. 1, 2018, now Pat. No. 10,784,344.

(30) Foreign Application Priority Data

Sep. 28, 2017 (KR) .................. 10-2017-0126077

(51) Int. Cl.
*H01L 27/148* (2006.01)
*H01L 29/06* (2006.01)
(Continued)

(52) U.S. Cl.
CPC .......... *H01L 29/0673* (2013.01); *B82Y 10/00* (2013.01); *H01L 21/0262* (2013.01);
(Continued)

(58) Field of Classification Search
CPC .......... H01L 29/0673; H01L 29/42392; H01L 29/0847; H01L 29/0653; H01L 27/0886;
(Continued)

(56) References Cited

U.S. PATENT DOCUMENTS 7,402,483 B2  7/2008  Yun et al.
9,425,318 B1  8/2016  Hoentschel et al.
(Continued)

FOREIGN PATENT DOCUMENTS

CN   104241360    12/2014
KR   20170048112   5/2017

OTHER PUBLICATIONS

Search Report and Written Opinion for corresponding Singaporean Application No. 10201808204V (9 pages) (dated Sep. 16, 2019).
(Continued)

*Primary Examiner* — Ismail A Muse
(74) *Attorney, Agent, or Firm* — Myers Bigel, P.A.

(57) ABSTRACT

Semiconductor devices are provided. A semiconductor device includes a substrate and a gate structure on the substrate. The semiconductor device includes a channel on the substrate. The semiconductor device includes a source/drain layer on the channel. Moreover, the semiconductor device includes a spacer on a sidewall of the gate structure. The spacer includes a central portion overlapping the channel in a vertical direction, and a protrusion portion protruding from the central portion. Related methods of manufacturing semiconductor devices are also provided.

20 Claims, 37 Drawing Sheets

(51) Int. Cl.
| | |
|---|---|
| *H01L 29/423* | (2006.01) |
| *H01L 29/08* | (2006.01) |
| *H01L 27/088* | (2006.01) |
| *H01L 29/78* | (2006.01) |
| *H01L 29/66* | (2006.01) |
| *H01L 21/306* | (2006.01) |
| *H01L 21/308* | (2006.01) |
| *H01L 21/02* | (2006.01) |
| *H01L 29/10* | (2006.01) |
| *B82Y 10/00* | (2011.01) |
| *H01L 29/786* | (2006.01) |
| *H01L 29/775* | (2006.01) |
| *H01L 29/40* | (2006.01) |
| *H01L 21/3105* | (2006.01) |
| *H01L 29/16* | (2006.01) |
| *H01L 29/165* | (2006.01) |
| *H01L 21/8234* | (2006.01) |

(52) U.S. Cl.
CPC .. *H01L 21/02529* (2013.01); *H01L 21/02532* (2013.01); *H01L 21/02636* (2013.01); *H01L 21/3081* (2013.01); *H01L 21/30604* (2013.01); *H01L 27/0886* (2013.01); *H01L 29/0653* (2013.01); *H01L 29/0692* (2013.01); *H01L 29/0847* (2013.01); *H01L 29/1033* (2013.01); *H01L 29/401* (2013.01); *H01L 29/42392* (2013.01); *H01L 29/6656* (2013.01); *H01L 29/66439* (2013.01); *H01L 29/66545* (2013.01); *H01L 29/66795* (2013.01); *H01L 29/775* (2013.01); *H01L 29/785* (2013.01); *H01L 29/78618* (2013.01); *H01L 29/78696* (2013.01); *H01L 21/31053* (2013.01); *H01L 21/823412* (2013.01); *H01L 21/823425* (2013.01); *H01L 27/088* (2013.01); *H01L 29/165* (2013.01); *H01L 29/1608* (2013.01)

(58) Field of Classification Search
CPC ............. H01L 29/785; H01L 29/66795; H01L 29/66545; H01L 21/30604; H01L 29/6656; H01L 21/3081; H01L 21/02636; H01L 21/02529; H01L 21/0262; H01L 21/02532; H01L 29/1033; H01L 21/31053; H01L 29/1608; H01L 29/165; H01L 29/78696; H01L 29/775

See application file for complete search history.

(56) References Cited

U.S. PATENT DOCUMENTS

| | | | |
|---|---|---|---|
| 9,530,789 B2 | 12/2016 | Lee et al. | |
| 9,590,038 B1 | 3/2017 | Kim et al. | |
| 9,620,590 B1 | 4/2017 | Bergendahl et al. | |
| 10,840,139 B2 * | 11/2020 | Seong | H01L 29/6656 |
| 10,847,416 B2 * | 11/2020 | Bai | H01L 21/76804 |
| 2012/0305997 A1 | 12/2012 | Lee et al. | |
| 2016/0027902 A1 | 1/2016 | Yoon et al. | |
| 2016/0111513 A1 | 4/2016 | Liu et al. | |
| 2017/0033044 A1 | 2/2017 | Choi et al. | |
| 2017/0110554 A1 | 4/2017 | Tak et al. | |
| 2017/0133462 A1 | 5/2017 | Kuhn et al. | |
| 2017/0154958 A1 | 6/2017 | Fung et al. | |
| 2017/0170294 A1 * | 6/2017 | Doris | H01L 29/7853 |
| 2017/0256608 A1 | 9/2017 | Suk et al. | |
| 2018/0006139 A1 | 1/2018 | Seo | |
| 2018/0076095 A1 | 3/2018 | Cheng et al. | |
| 2018/0226452 A1 | 8/2018 | Nam | |
| 2019/0058052 A1 | 2/2019 | Frougier et al. | |
| 2019/0157420 A1 | 5/2019 | Cheng et al. | |
| 2019/0181224 A1 | 6/2019 | Zhang et al. | |
| 2019/0189769 A1 | 6/2019 | Basker et al. | |
| 2019/0214461 A1 | 7/2019 | Kim et al. | |
| 2019/0273143 A1 | 9/2019 | Leobandung | |
| 2019/0273144 A1 | 9/2019 | Leobandung | |
| 2020/0006333 A1 * | 1/2020 | Noh | H01L 29/6656 |
| 2020/0098861 A1 * | 3/2020 | Lee | H01L 21/02164 |

OTHER PUBLICATIONS

Indian Office Action for corresponding Indian Application No. 201834035957 (7 pages) (dated Sep. 30, 2020).

* cited by examiner

2ND DIRECTION

3RD DIRECTION — 1ST DIRECTION

US 11,222,949 B2

SEMICONDUCTOR DEVICES AND METHODS OF MANUFACTURING THE SAME

CROSS-REFERENCE TO RELATED APPLICATION

This application is a continuation of and claims priority from U.S. patent application Ser. No. 16/052,091, filed on Aug. 1, 2018, which claims priority under 35 USC § 119 to Korean Patent Application No. 10-2017-0126077, filed on Sep. 28, 2017 in the Korean Intellectual Property Office (KIPO), the contents of each are hereby incorporated herein by reference in their entireties.

BACKGROUND

The present disclosure relates to semiconductor devices. When a multi-bridge-channel MOSFET (MBCFET) is formed, a fin structure may be formed, a dummy gate structure and a gate spacer covering a sidewall of the dummy gate structure may be formed on the fin structure, and the fin structure may be etched using the dummy gate structure and the gate spacer as an etching mask. After forming a source/drain layer adjacent the gate structure, the dummy gate structure may be replaced by a gate structure. If the gate structure and the source/drain layer are not electrically insulated from each other, an electrical short may occur therebetween.

SUMMARY

Example embodiments provide a semiconductor device having good electrical characteristics.

Example embodiments provide a method of manufacturing a semiconductor device having good electrical characteristics.

According to example embodiments, a semiconductor device is provided. The semiconductor device may include a substrate. The semiconductor device may include channels spaced apart from each other in a vertical direction on an upper surface of the substrate. The semiconductor device may include a gate structure on the channels. The semiconductor device may include a first spacer on a sidewall of the gate structure. The first spacer may include a central portion overlapping the channels in the vertical direction. The first spacer may include a protrusion portion protruding from the central portion. The protrusion portion may not overlap the channels in the vertical direction. Moreover, the semiconductor device may include a source/drain layer on sidewalls of the channels.

A semiconductor device, according to various embodiments, may include a substrate. The semiconductor device may include a gate structure on the substrate. The semiconductor device may include a channel extending through the gate structure. The semiconductor device may include a source/drain layer on the channel. Moreover, the semiconductor device may include a first spacer on a sidewall of the gate structure and electrically insulating the gate structure from the source/drain layer. The first spacer may include a central portion overlapping the channel in a vertical direction. The first spacer may include a protrusion portion protruding from the central portion. The protrusion portion may not overlap the channel in the vertical direction.

A semiconductor device, according to various embodiments, may include a substrate. The semiconductor device may include a source/drain layer on the substrate. The semiconductor device may include a first gate structure at a first side of the source/drain layer. The semiconductor device may include a first channel extending through the first gate structure and connecting to the source/drain layer. Moreover, the semiconductor device may include a first spacer on a sidewall of the first gate structure that faces the source/drain layer. The first spacer may electrically insulate the first gate structure from the source/drain layer. The first spacer may include a first protrusion portion not overlapping the first channel in a vertical direction substantially perpendicular to an upper surface of the substrate.

A method of manufacturing a semiconductor device, according to various embodiments, may include forming a fin structure on a substrate. The fin structure may include sacrificial lines and semiconductor lines that are alternately and repeatedly stacked. The method may include forming a dummy gate structure on the fin structure and the substrate. The dummy gate structure may include a dummy gate insulation pattern and a dummy gate electrode that are sequentially stacked. The method may include etching the fin structure using the dummy gate structure as an etching mask to expose an upper surface of the substrate. The method may include etching sidewalls of the sacrificial lines to form a first recess. The method may include etching a portion of the dummy gate insulation pattern exposed by the first recess to form a second recess. The method may include forming a first spacer in the first and second recesses. The method may include forming a source/drain layer on the upper surface of the substrate. Moreover, the method may include replacing the dummy gate structure with a gate structure.

A method of manufacturing a semiconductor device, according to various embodiments, may include forming a fin structure on a substrate. The fin structure may extend in a first direction. The method may include forming a dummy gate structure on the fin structure and the substrate. The dummy gate structure may include a dummy gate insulation pattern and a dummy gate electrode sequentially stacked and extending in a second direction substantially perpendicular to the first direction. A protrusion portion of the dummy gate insulation pattern may not overlap the dummy gate electrode in a vertical third direction substantially perpendicular to an upper surface of the substrate. The method may include forming a second spacer on a sidewall of the dummy gate structure. The method may include etching the fin structure using the dummy gate structure and the second spacer as an etching mask to expose the upper surface of the substrate. The method may include etching a portion of the dummy gate structure to form a first recess. The method may include etching the protrusion portion of the dummy gate insulation pattern to form a second recess. The method may include forming a first spacer in the first and second recesses. The method may include forming a source/drain layer on the upper surface of the substrate. The method may include replacing the dummy gate structure with a gate structure.

In a semiconductor device in accordance with example embodiments, the spacer structure of the MBCFET on (e.g., covering) a sidewall of the gate structure may include a protrusion (i.e., protruding) portion that does not vertically overlap the channel, and thus electrical isolation between the gate structure and the source/drain layer may be improved/secured.

BRIEF DESCRIPTION OF THE DRAWINGS

FIGS. 6, 8, 10, 15, 19, 22, 24, 27, and 29 are plan views, FIGS. 7, 9, 12-14, 17, 18, 21, 26, 28, 31, and 32 are vertical cross-sectional views, and FIGS. 11, 16, 20, 23, 25, and 30 are enlarged horizontal cross-sectional views.

DESCRIPTION

Figure 1:
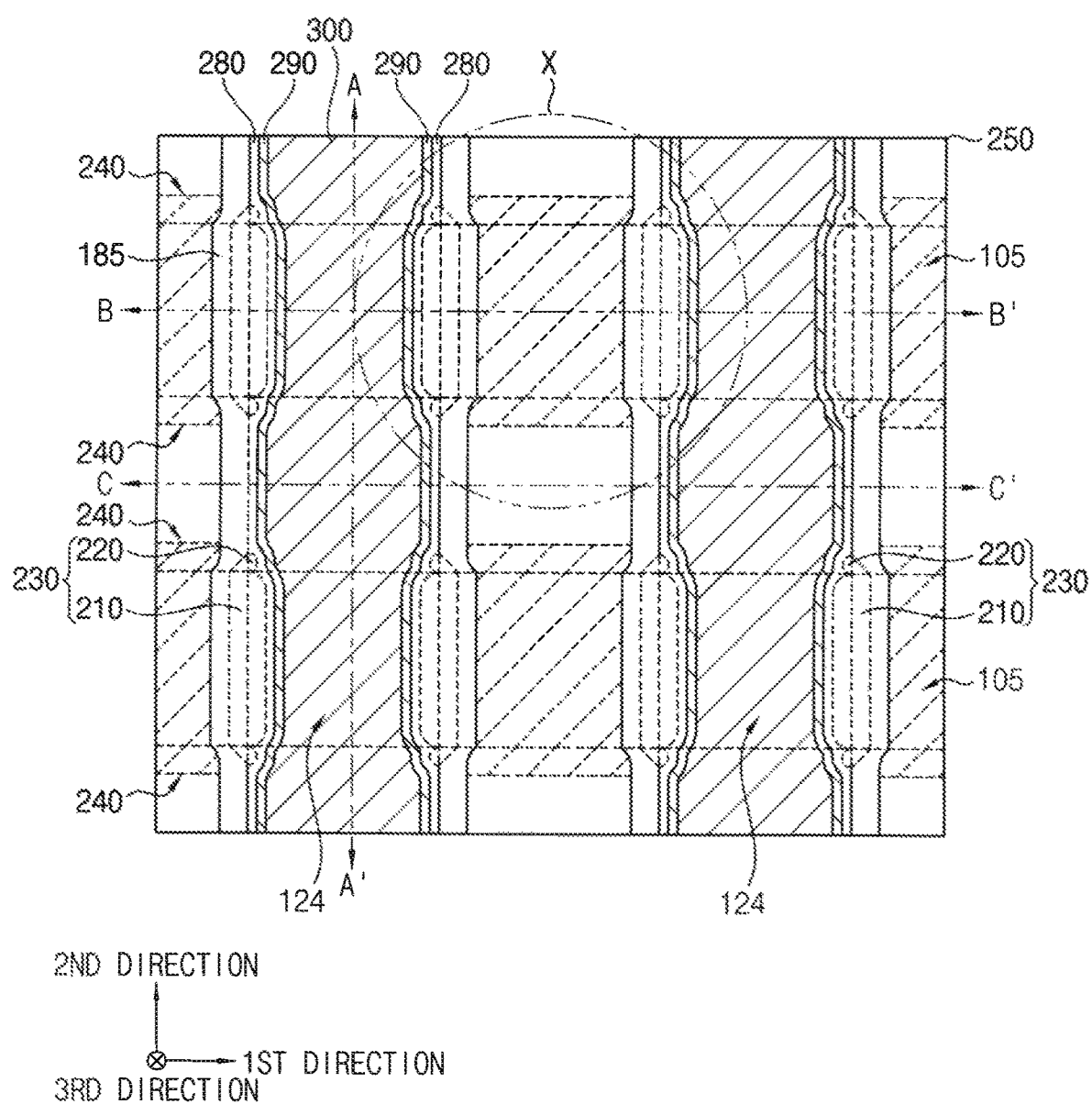
FIG. 1 is a plan view illustrating a semiconductor device in accordance with example embodiments.
Figure 2:
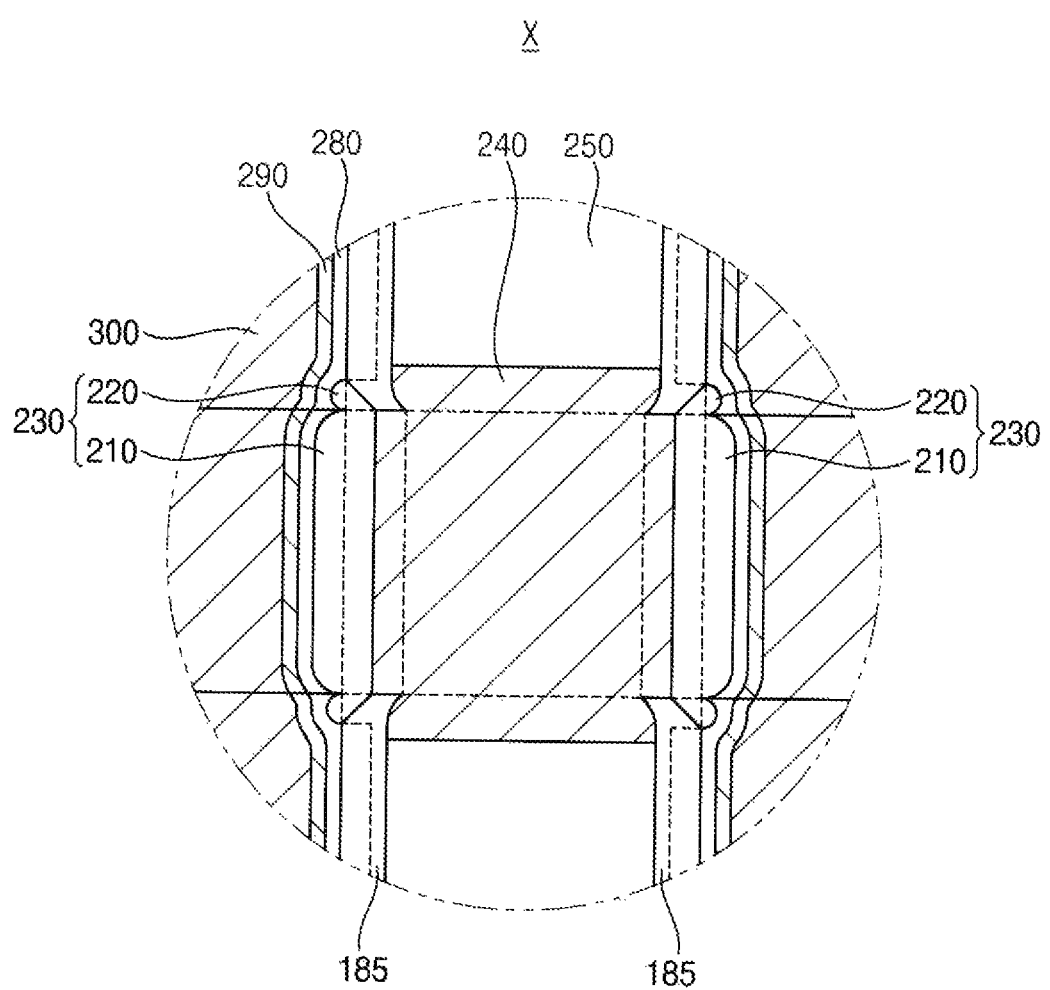
FIG. 2 is an enlarged horizontal cross-sectional view illustrating the semiconductor device.
Figure 3:
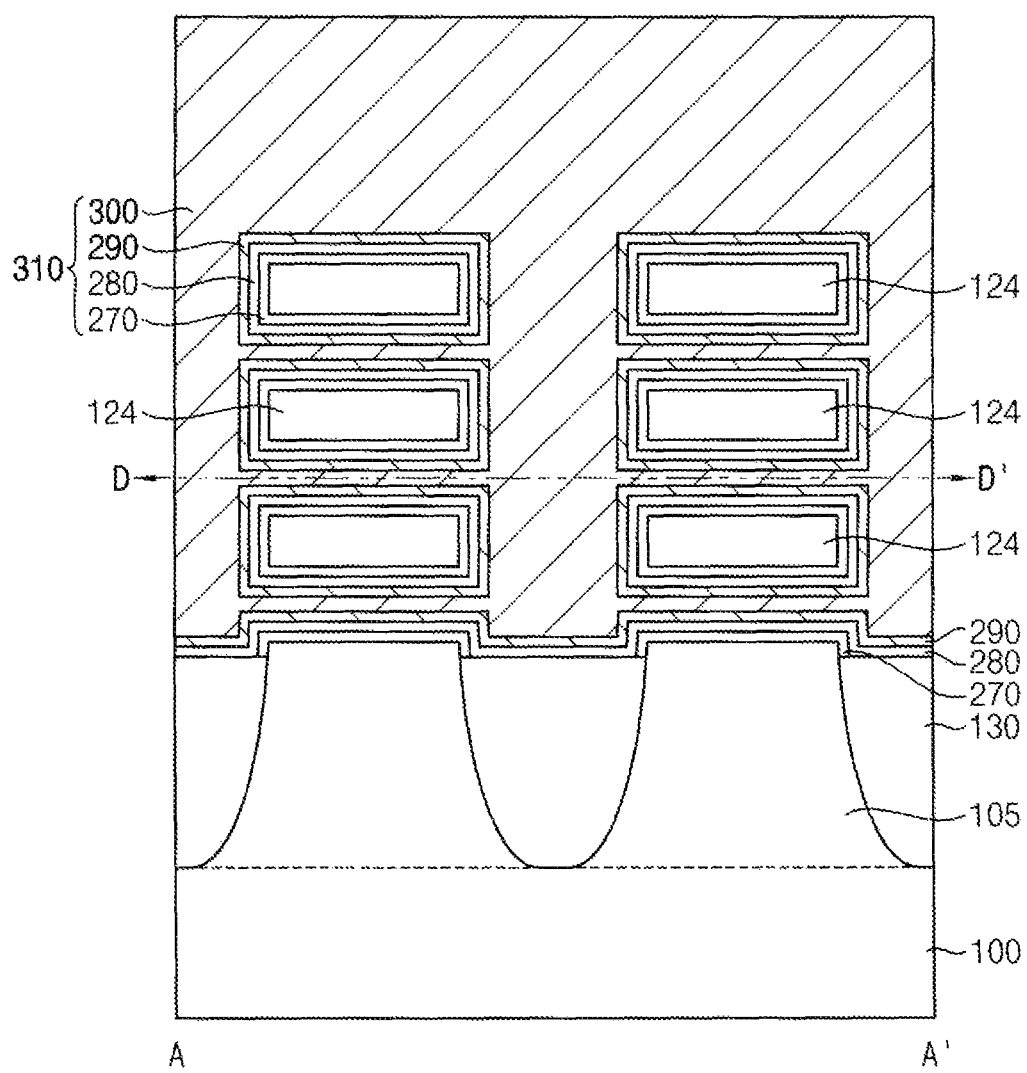
FIGS. 3-5 are vertical cross-sectional views illustrating the semiconductor device.
Figure 4:
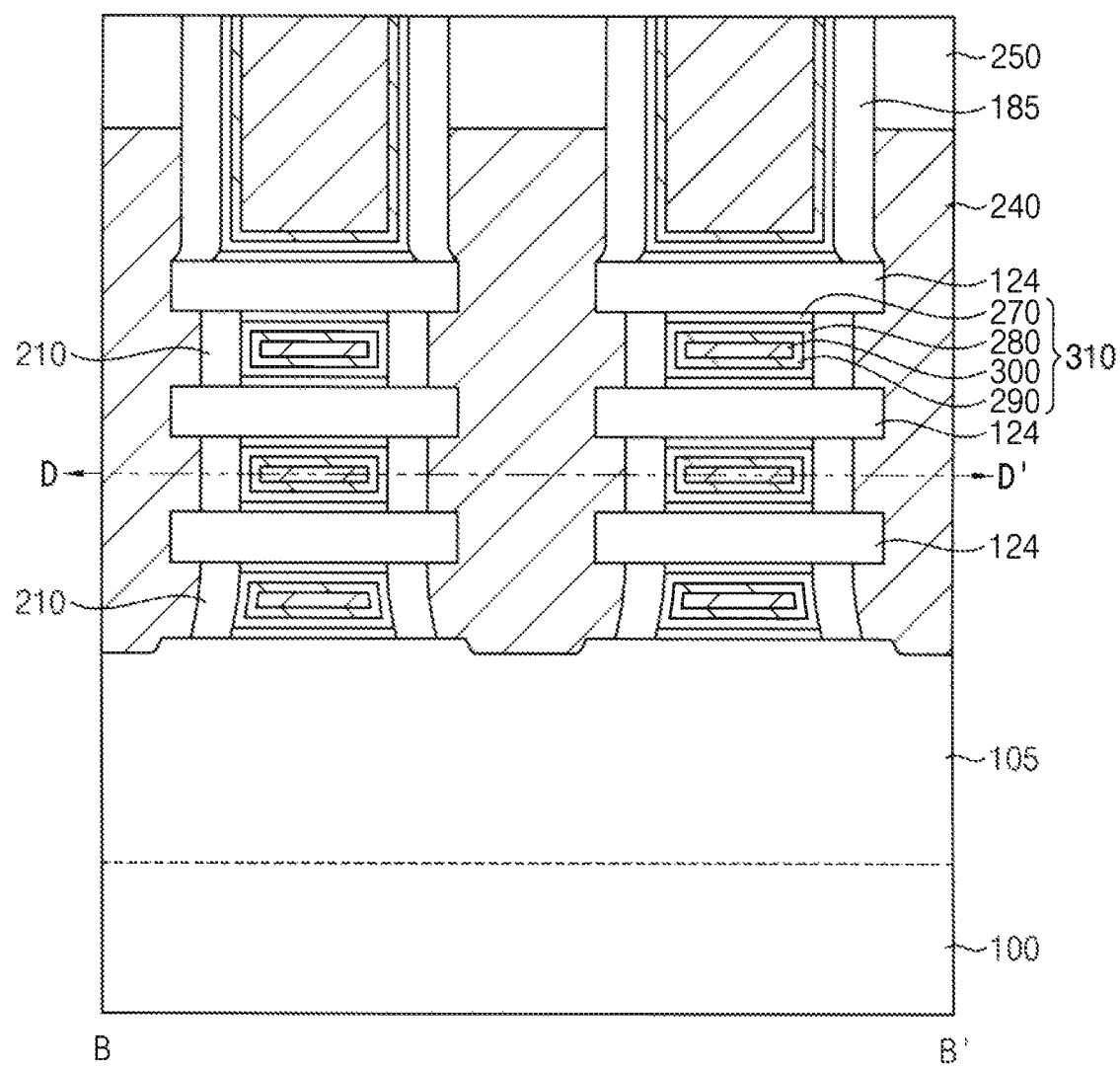
Figure 4:
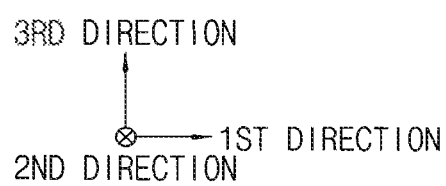
Figure 5:
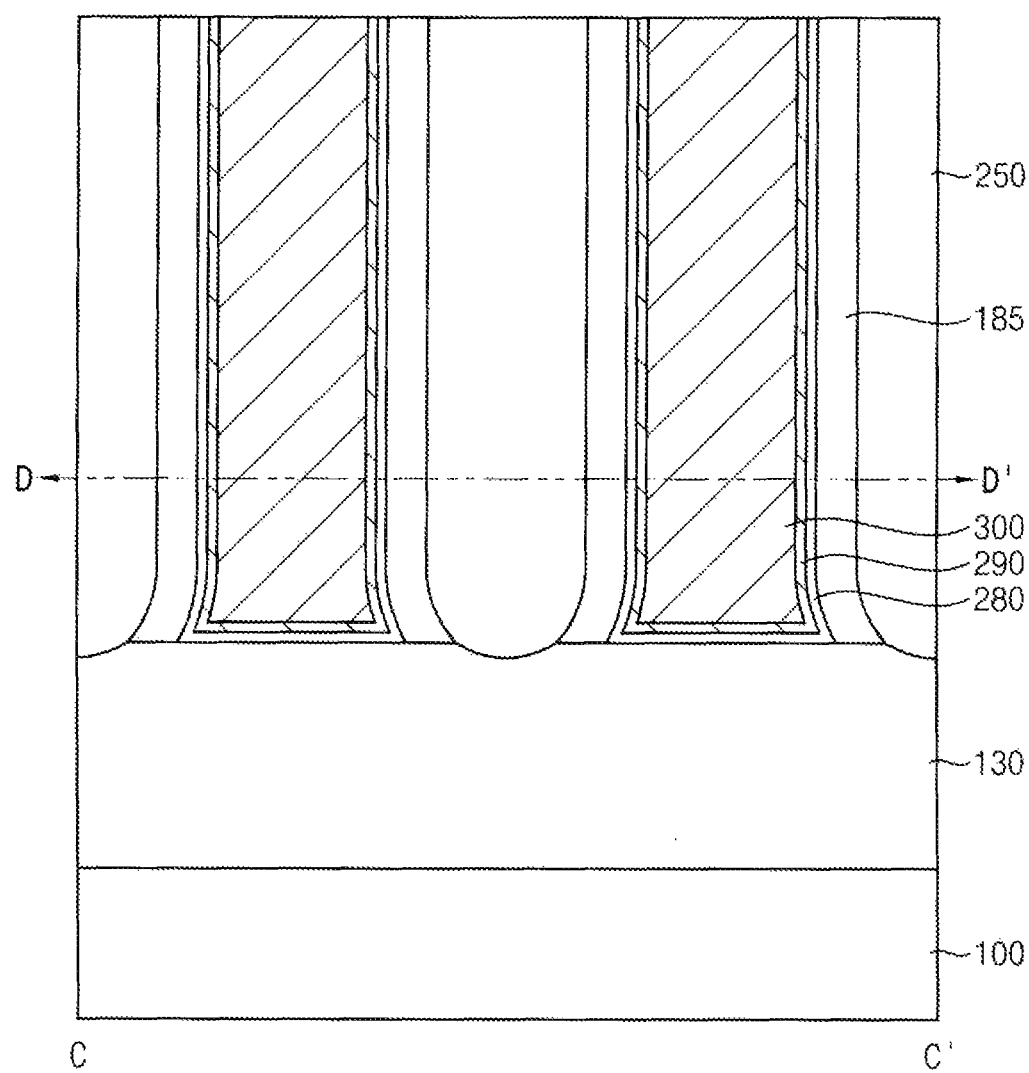

FIGS. 1 to 5 are a plan view and cross-sectional views illustrating a semiconductor device in accordance with example embodiments. FIG. 1 is the plan view, FIG. 2 is a horizontal cross-sectional view, and FIGS. 3 to 5 are vertical cross-sectional views.

FIG. 3 is a cross-sectional view taken along a line A-A' of FIG. 1, FIG. 4 is a cross-sectional view taken along a line B-B' of FIG. 1, and FIG. 5 is a cross-sectional view taken along a line C-C' of FIG. 1. FIG. 2 is a horizontal cross-sectional view of a region X of FIG. 1, which may be taken along lines D-D' of FIGS. 3 to 5.

Hereinafter, two directions substantially parallel to an upper surface of a substrate 100 and crossing each other may be referred to as first and second directions, respectively, and a direction substantially perpendicular to the upper surface of the substrate 100 may be referred to as a third direction. In example embodiments, the first and second directions may be substantially perpendicular to each other.

Referring to FIGS. 1 to 5, the semiconductor device may include a semiconductor pattern 124, a gate structure 310, an epitaxial layer 240, and a first spacer 230 on the substrate 100. The semiconductor device may further include an active region 105, an isolation pattern 130, a second spacer 185, and an insulation layer 250.

The substrate 100 may include a semiconductor material, e.g., silicon, germanium, silicon-germanium, etc., or III-V semiconductor compounds, e.g., gallium phosphide (GaP), gallium arsenide (GaAs), gallium antimonide (GaSb), etc. In some embodiments, the substrate 100 may be a silicon-on-insulator (SOI) substrate, or a germanium-on-insulator (GOI) substrate.

The active region 105 may protrude from the substrate 100 in the third direction, and may extend in the first direction. In the figures, two active regions 105 are shown. The inventive concepts, however, are not limited thereto. Thus, more than two active regions 105 may be spaced apart from each other in the second direction. Each active region 105 may be formed by partially removing an upper portion of the substrate 100, and thus may include a material substantially the same as that of the substrate 100.

A sidewall of the active region 105 may be covered by the isolation pattern 130. The isolation pattern 130 may include an oxide, e.g., silicon oxide.

A plurality of semiconductor patterns 124 may be formed at a plurality of levels, respectively, to be spaced apart from each other in the third direction from an upper surface of the active region 105. In the figures, the semiconductor patterns 124 are shown at three levels, respectively. The inventive concepts, however, are not limited thereto.

In the figures, only two semiconductor patterns 124 spaced apart from each other in the first direction are shown at each level on the active region 105 extending in the first direction. The inventive concepts, however, are not limited thereto. Thus, more than two semiconductor patterns 124 may be formed to be spaced apart from each other in the first direction at each level on the active region 105.

In example embodiments, the semiconductor pattern 124 may be nanosheets or nanowires including a semiconductor material, e.g., silicon, germanium, etc. In example embodiments, the semiconductor pattern 124 may serve as a channel of a transistor, which may be referred to as the channel.

The epitaxial layer 240 may extend in the third direction from the upper surface of the active region 105, and may commonly contact respective sidewalls of the semiconductor patterns 124 at the plurality of levels to be connected thereto. The epitaxial layer 240 may contact an outer sidewall of the first spacer 230 and a lower outer sidewall of the second spacer 185. As shown in FIG. 4, a sidewall of the first spacer 230 and/or a sidewall of the second spacer 185 may include a sloped (e.g., curved/slanted) portion that is between the gate structure 310 and the epitaxial layer 240. This may result from forming the first spacer 230 and/or the second spacer 185 on a sloped portion of a dummy structure that precedes the gate structure 310.

In example embodiments, the epitaxial layer 240 may include single crystalline silicon carbide doped with n-type impurities or single crystalline silicon doped with n-type impurities, and thus may serve as a source/drain layer of an NMOS transistor. Alternatively, the epitaxial layer 240 may include single crystalline silicon-germanium doped with p-type impurities, and thus may serve as a source/drain layer of a PMOS transistor. The epitaxial layer 240 may be referred to as a source/drain layer.

The gate structure 310 may be formed on the substrate 100, and may surround a central portion of the semiconductor pattern 124 in the first direction. In the figures, the gate structure 310 is shown to cover the semiconductor patterns 124 on two active regions 105. The inventive concepts, however, are not limited thereto. That is, the gate structure 310 may extend in the second direction, and may cover the semiconductor patterns 124 on more than two active regions 105 spaced apart from each other in the second direction, or the semiconductor patterns 124 on only one active region 105.

In the figures, two gate structures 310 are shown on the substrate 100. The inventive concepts, however, are not limited thereto. Thus, more than two gate structures 310 spaced apart from each other in the first direction may be formed on the substrate 100.

The gate structure 310 may include an interface pattern 270, a gate insulation pattern 280, a workfunction control pattern 290, and a gate electrode 300 sequentially stacked from a surface of each of the semiconductor patterns 124 or the upper surface of the active region 105.

The interface pattern 270 may be formed on the upper surface of the active region 105 and the surfaces of the semiconductor patterns 124, and the gate insulation pattern 280 may be formed on a surface of the interface pattern 270, and inner sidewalls of the first and second spacers 230 and 185. The workfunction control pattern 290 may be formed on the gate insulation pattern 280, and the gate electrode 300 may fill a space between the semiconductor patterns 124 spaced apart from each other in the third direction and a space defined by an inside of the second spacer 185 on an uppermost one of the semiconductor patterns 124.

The interface pattern 270 may include an oxide, e.g., silicon oxide, and the gate insulation pattern 280 may include a metal oxide having a high-k dielectric constant, e.g., hafnium oxide, tantalum oxide, zirconium oxide, etc.

The workfunction control pattern 290 may include, e.g., titanium nitride, titanium oxynitride, titanium oxycarbonitride, titanium silicon nitride, titanium silicon oxynitride, titanium aluminum oxynitride, tantalum nitride, tantalum oxynitride, tantalum aluminum nitride, tantalum aluminum oxynitride, tungsten nitride, tungsten carbonitride, aluminum oxide, etc. The gate electrode 300 may include a metal, e.g., titanium, aluminum, etc., a metal alloy, or a nitride or carbide of the metal.

The gate structure 310 together with the epitaxial layer 240 serving as a source/drain layer, and the semiconductor pattern 124 serving as a channel may form a transistor. The transistor may be an NMOS transistor or a PMOS transistor according to the conductivity type of the impurities doped in the epitaxial layer 240. The transistor may include the plurality of semiconductor patterns 124 sequentially stacked in the third direction, and thus may be an MBCFET.

The first spacer 230 may cover a lower portion of each of opposite sidewalls of the gate structure 310 in the first direction, and the second spacer 185 may cover an upper portion of each of opposite sidewalls of the gate structure 310 in the first direction. The first and second spacers 230 and 185 may be referred to as a spacer structure.

Particularly, the first spacer 230 may be formed between the semiconductor patterns 124 at a plurality of levels or between the upper surface of the active region 105 and a lowermost one of the semiconductor patterns 124, and the second spacer 185 may be formed on the uppermost one of the semiconductor patterns 124 to cover an upper portion of a sidewall of the gate structure 310. Thus, the gate structure 310 may be electrically insulated from the epitaxial layer 240 by the first and second spacers 230 and 185.

In example embodiments, the first spacer 230 may include a central portion 210 overlapping the semiconductor pattern 124 in the third direction and a protrusion portion 220 protruding from the central portion 210 in the second direction. That is, the central portion 210 of the first spacer 230 may extend between the semiconductor patterns 124 or between the upper surface of the active region 105 and the lowermost one of the semiconductor patterns 124, and the protrusion portion 220 of the first spacer 230 may protrude from each of opposite ends of the central portion 210 in the second direction not to overlap the semiconductor patterns 124 in the third direction. In example embodiments, the protrusion portions 220 at the opposite ends of the central portion 210 of the first spacer 230 may have a symmetric shape with each other. Moreover, as shown in FIG. 2, in some embodiments, two of the first spacers 230 may have respective horizontal cross-sections that are symmetric with respect to an axis extending in the second direction through a central (i.e., center) point of the epitaxial (e.g., source/drain) layer 240 between the two of the first spacers 230.

In example embodiments, an end of the protrusion portion 220 of the first spacer 230 may contact the epitaxial layer 240. Thus, if no protrusion portion is formed at the first spacer 230, the space may be filled with the gate structure 310, and the gate structure 310 and the epitaxial layer 240 may contact each other. However, in example embodiments, the first spacer 230 may include the protrusion portion 220, and thus the gate structure 310 and the epitaxial layer 240 may not directly contact each other, and the electrical insulation therebetween may be obtained. This feature may be explained in a method of manufacturing a semiconductor device subsequently illustrated with reference to FIGS. 6 to 32.

In example embodiments, the first spacer 230 may at least partially overlap the overlying second spacer 185 in the third direction. In the figures, an outer sidewall of the central portion 210 of the first spacer 230 is not aligned with an outer sidewall of the second spacer 185 in the third direction, and an inner sidewall of the central portion 210 of the first spacer 230 is not aligned with an inner sidewall of the second spacer 185 in the third direction. The inventive concepts, however, are not limited thereto.

In some example embodiments, the inner sidewall of the first spacer 230 may overlap a portion of the gate structure 310 on the uppermost one of the semiconductor patterns 124 in the third direction, and thus a width in the first direction of a portion of the gate structure 310 under the uppermost one of the semiconductor patterns 124 may be less than that of the portion of the gate structure 310 on the uppermost one of the semiconductor patterns 124. The inventive concepts, however, are not limited thereto. That is, the width in the first direction of the portion of the gate structure 310 under the uppermost one of the semiconductor patterns 124 may be equal to or more than that of the portion of the gate structure 310 on the uppermost one of the semiconductor patterns 124.

The first spacer 230 may include a nitride, e.g., silicon nitride, silicon carbonitride, silicon boron nitride, silicon oxycarbonitride, etc., and the second spacer 185 may include a nitride, e.g., silicon nitride.

The insulation layer 250 may surround the sidewall of the second spacer 185 to cover the epitaxial layer 240. The insulation layer 250 may include an oxide, e.g., silicon oxide.

The semiconductor device may further include contact plugs, wirings, etc., electrically connected to the epitaxial layer 240 and/or the gate structure 310.

As illustrated above, in the semiconductor device, the gate structure 310 and the epitaxial layer 240 adjacent thereto may be electrically insulated from each other by the first and second spacers 230 and 185. Particularly, the first spacer 230 may include the protrusion portion 220 not overlapping the semiconductor pattern 124 in the third direction, and thus the electrical insulation between the gate structure 310 and the epitaxial layer 240 may be secured. For example, in a vertical cross-sectional view, the protrusion portion 220 and the semiconductor pattern 124 may not overlap in the third direction.

FIGS. 6 to 32 are plan views and cross-sectional views illustrating a method of manufacturing a semiconductor device in accordance with example embodiments. FIGS. 6, 8, 10, 15, 19, 22, 24, 27 and 29 are the plan views, FIGS. 7, 9, 12-14, 17-18, 21, 26, 28 and 31-32 are vertical cross-sectional views, and FIGS. 11, 16, 20, 23, 25 and 30 are horizontal cross-sectional views.

Figure 7:
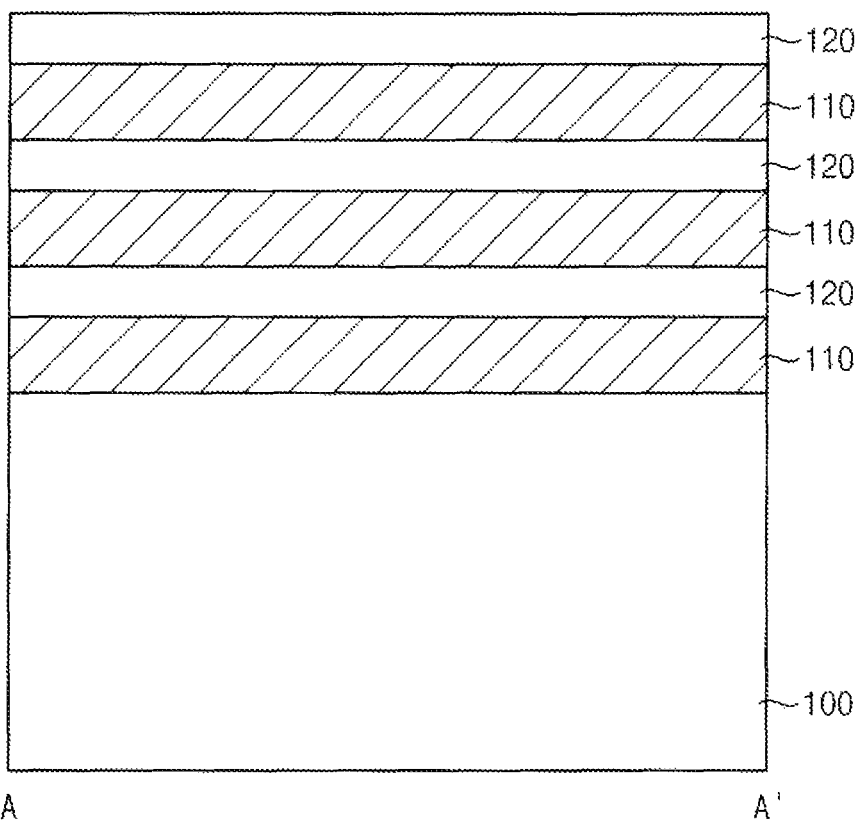
Figure 7:
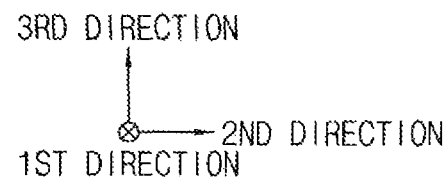
Figure 9:
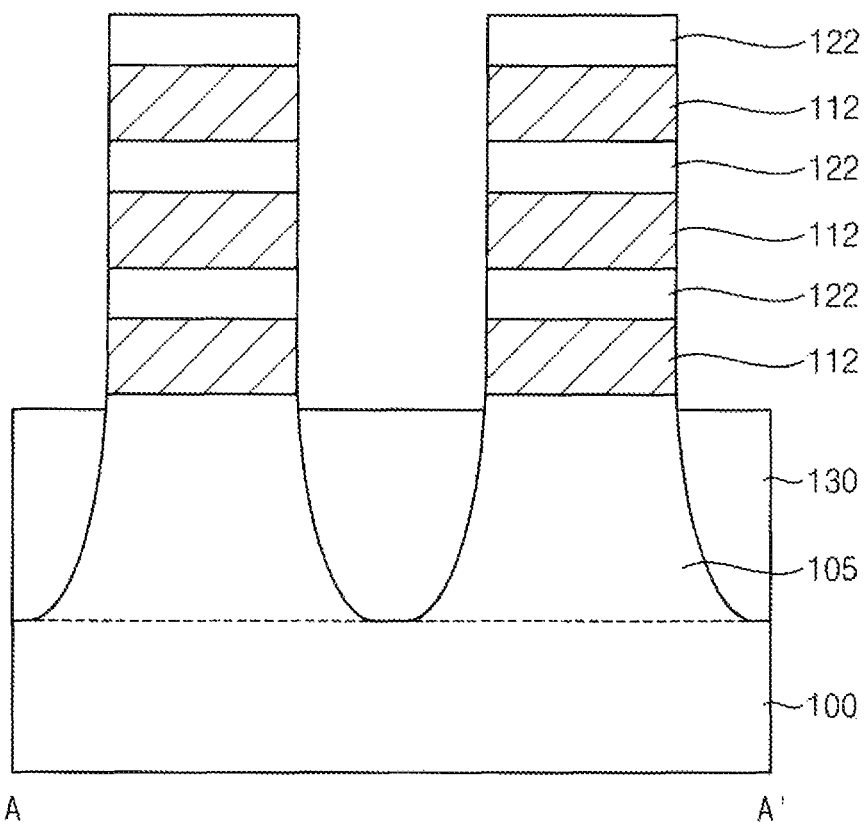
Figure 9:
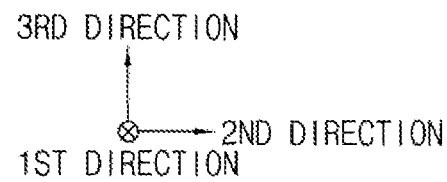
Figure 10:
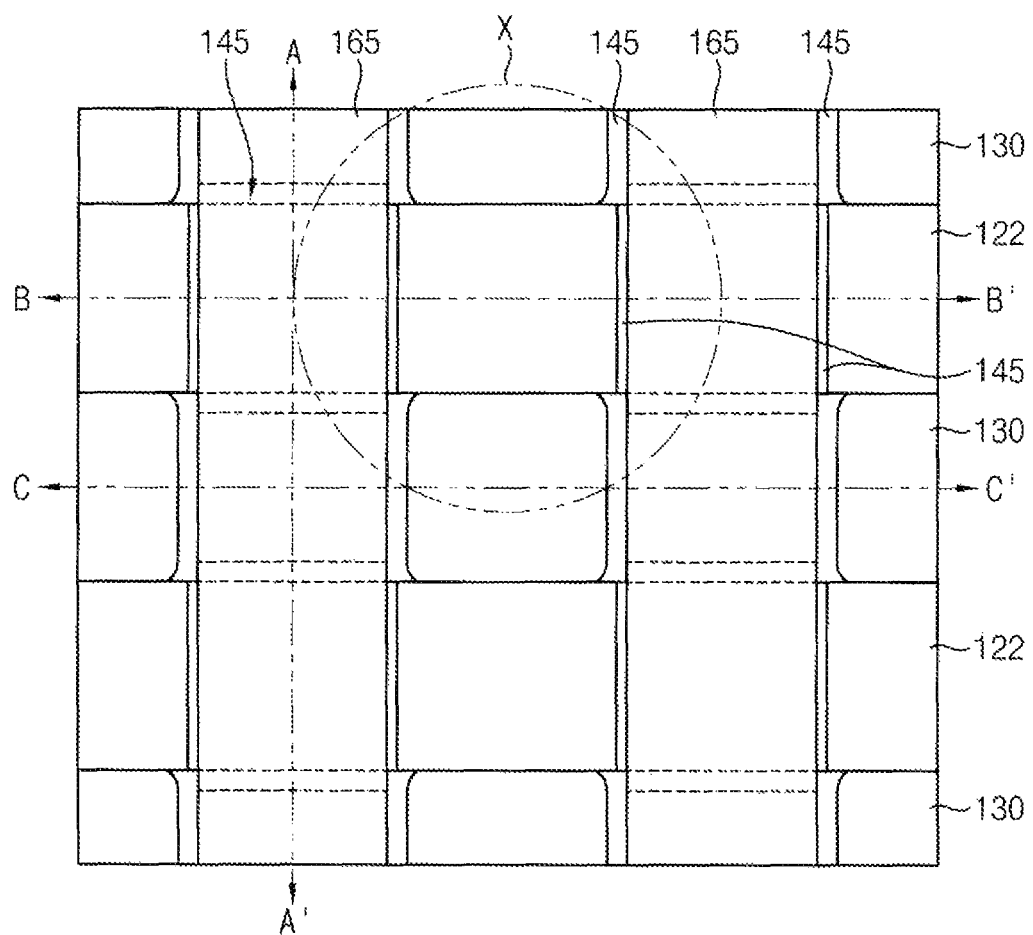
Figure 11:
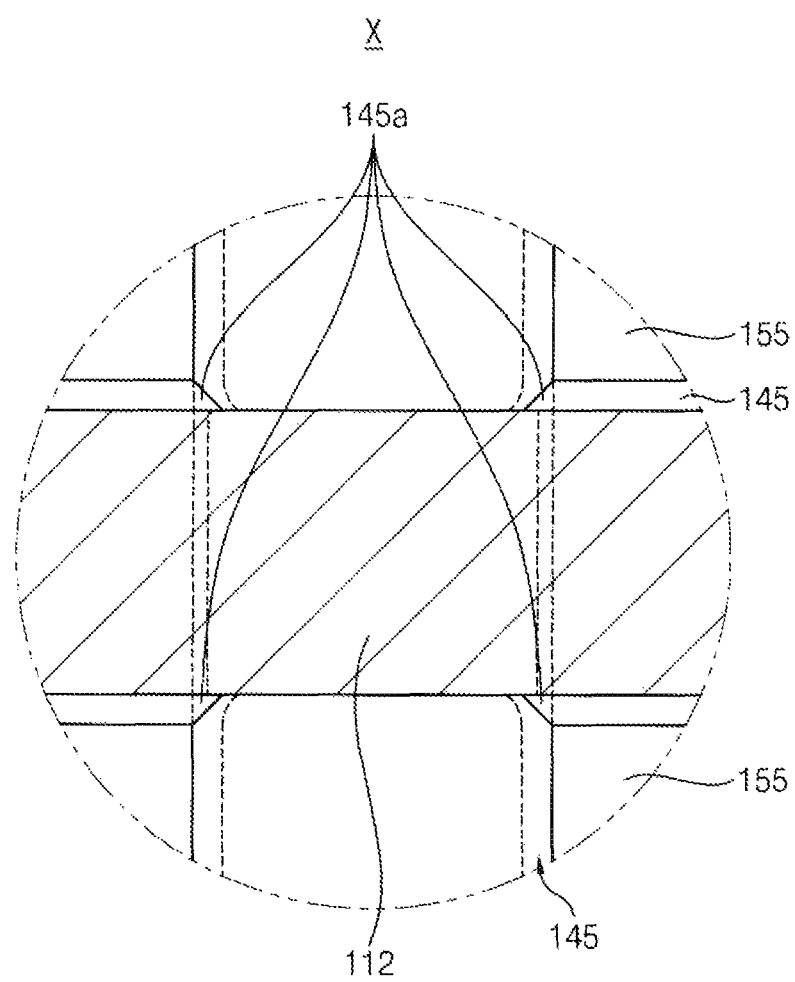
Figure 12:
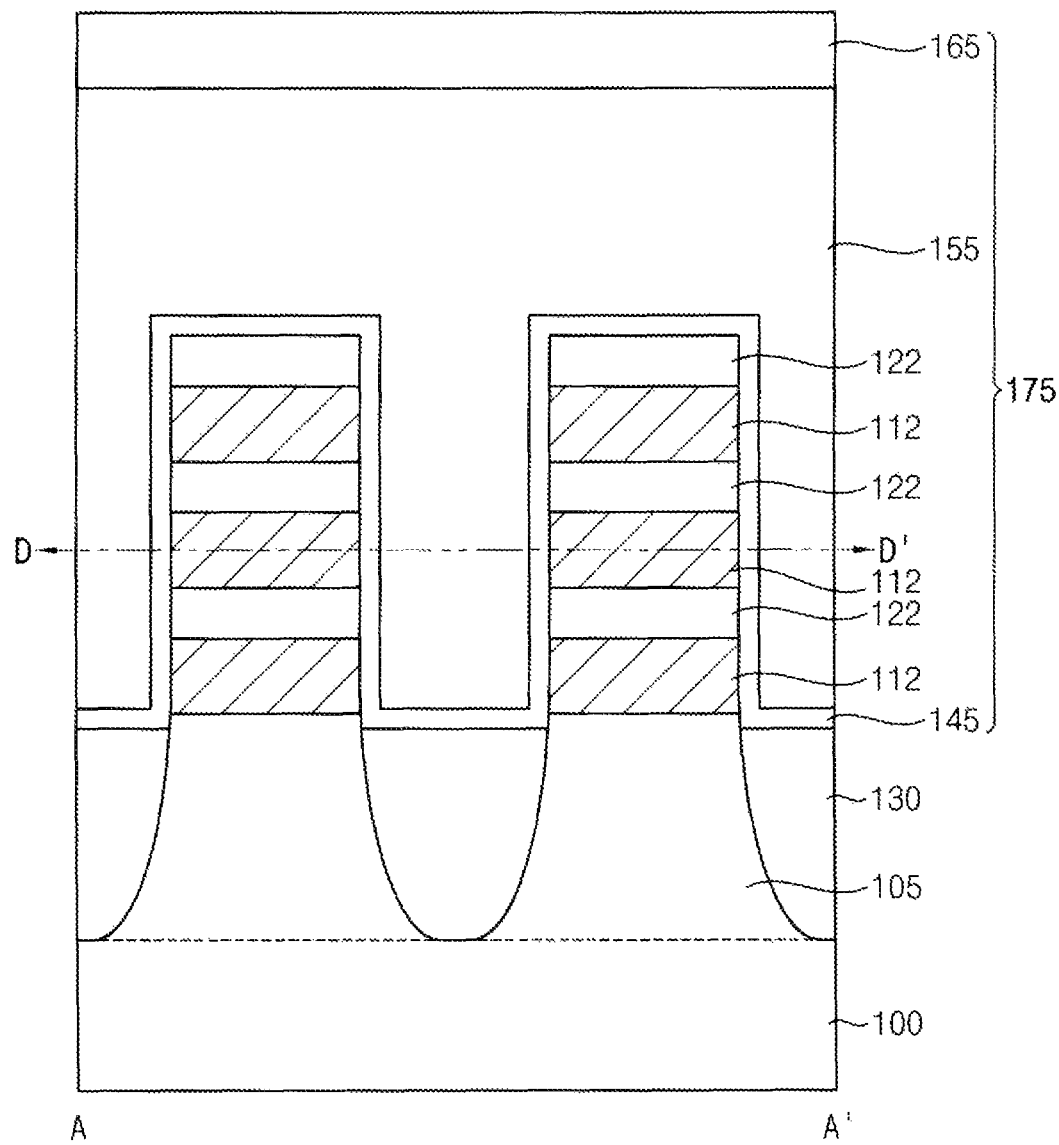
Figure 12:
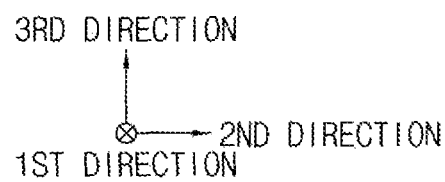
Figure 13:
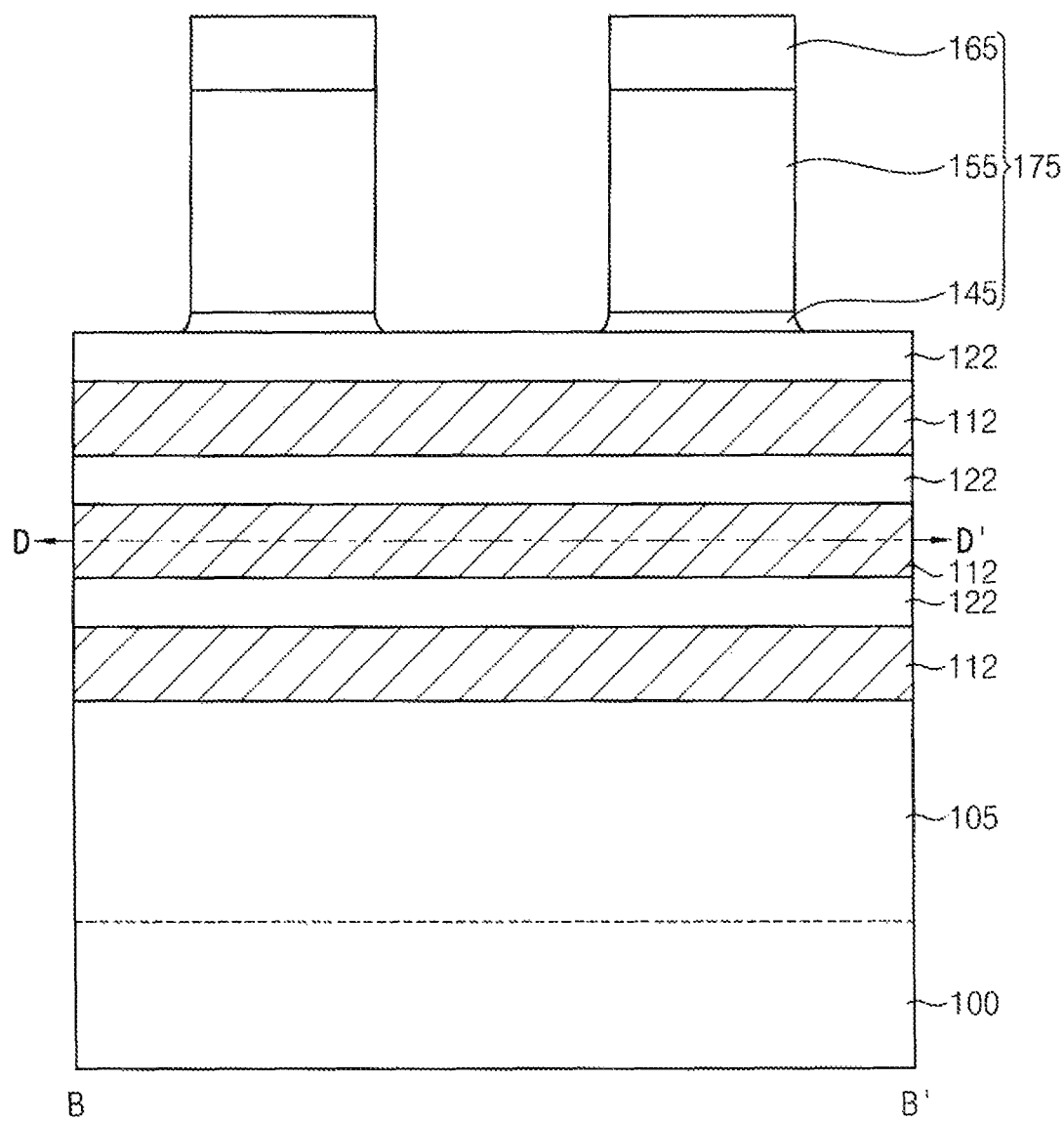
Figure 14:
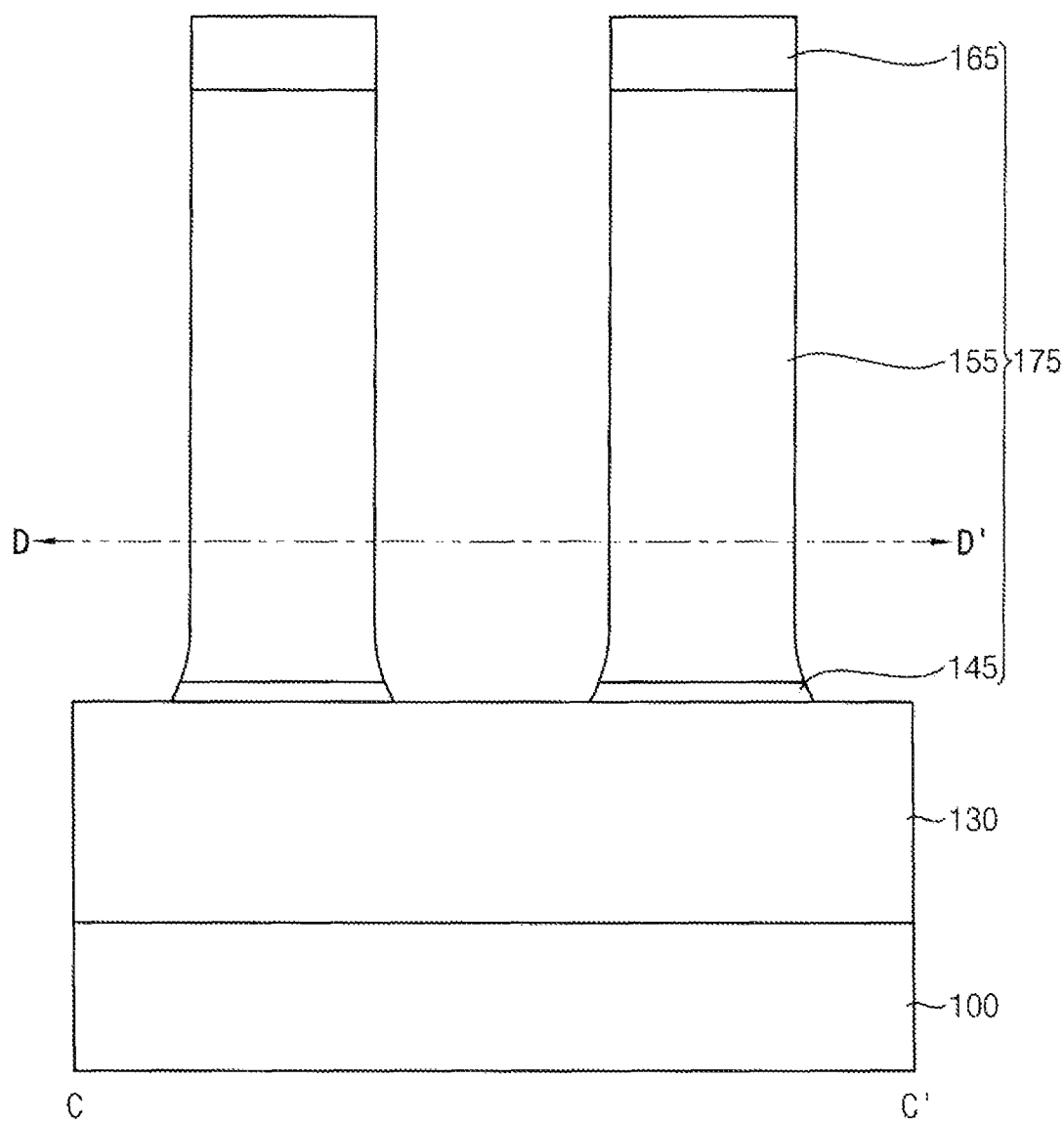
Figure 15:
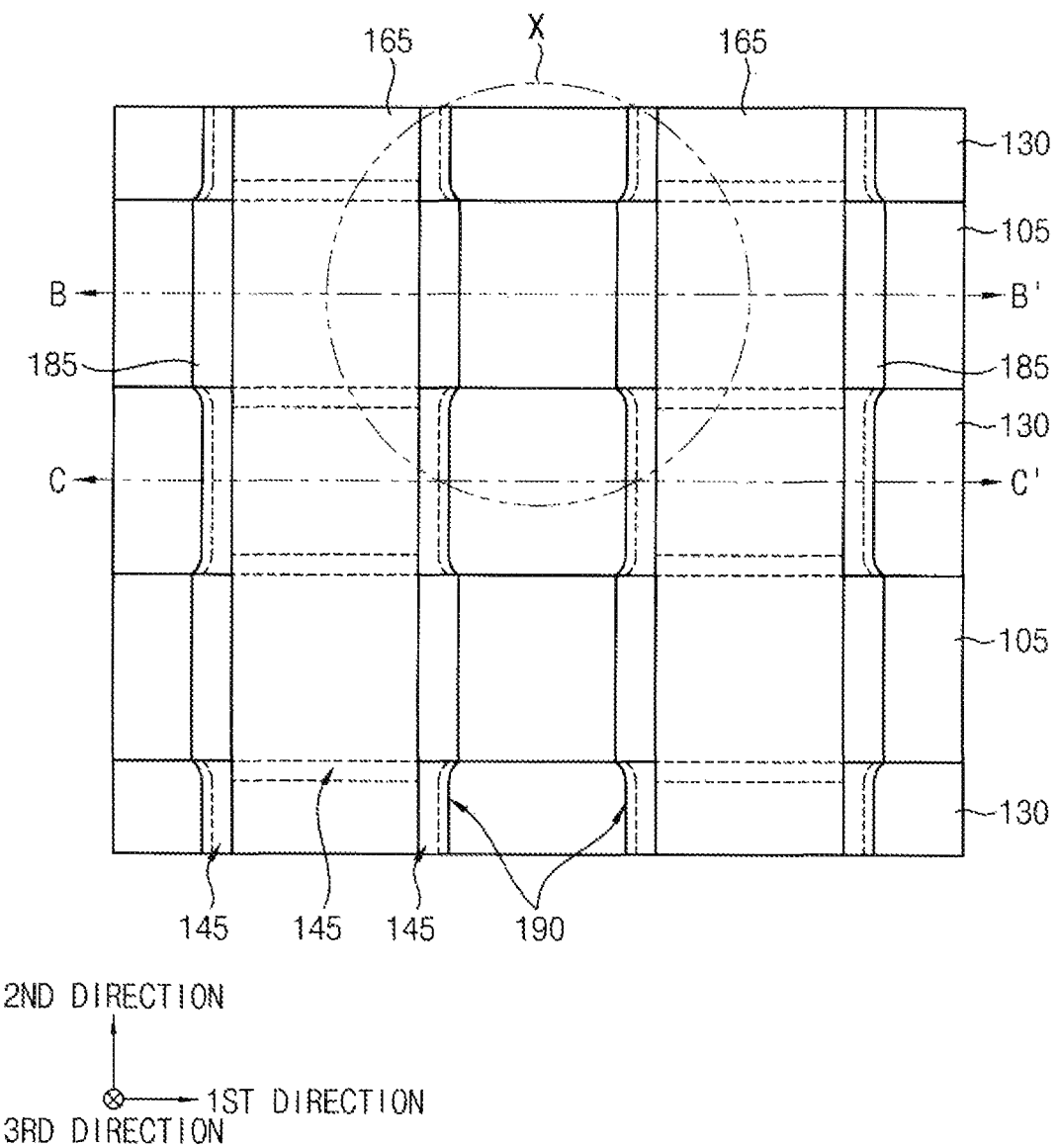
Figure 16:
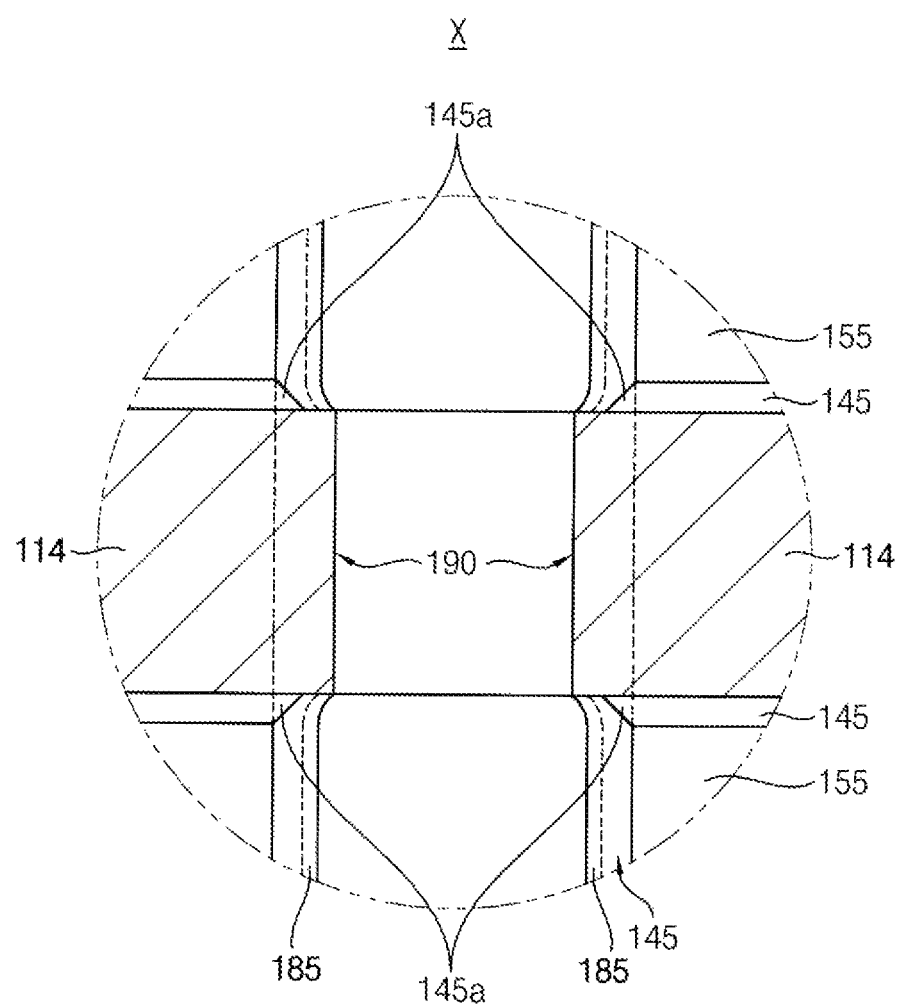
Figure 17:
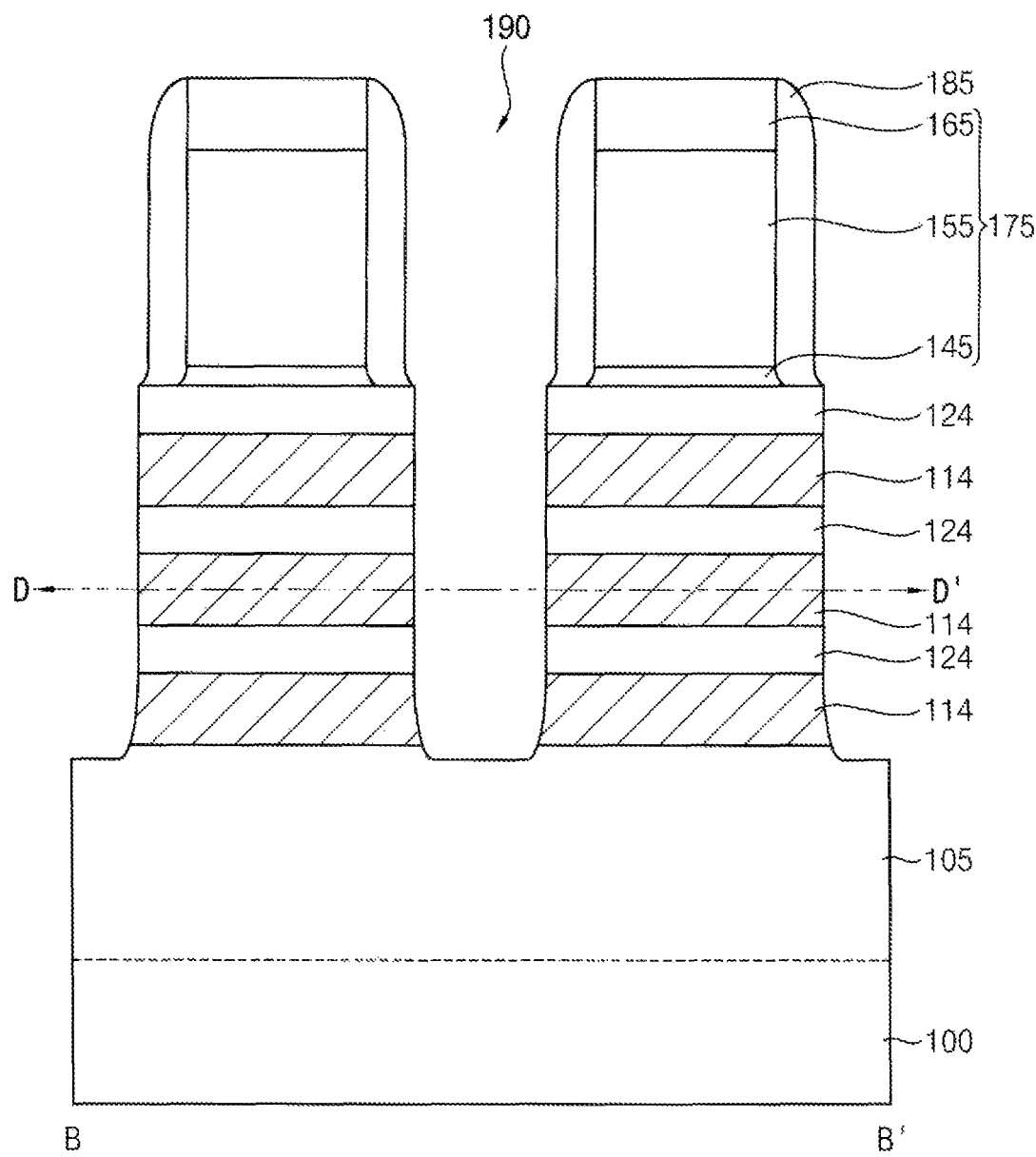
Figure 18:
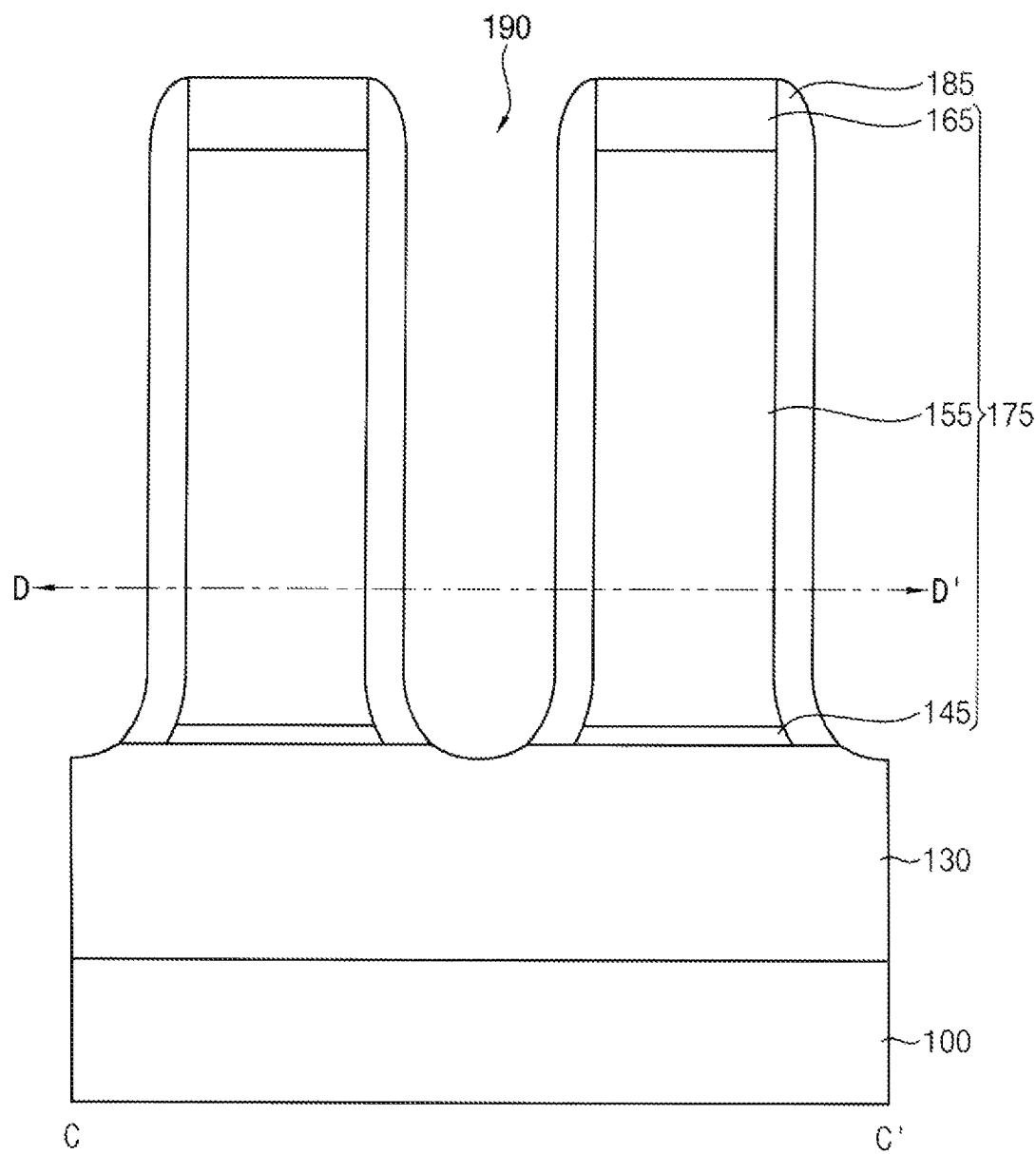
Figure 32:
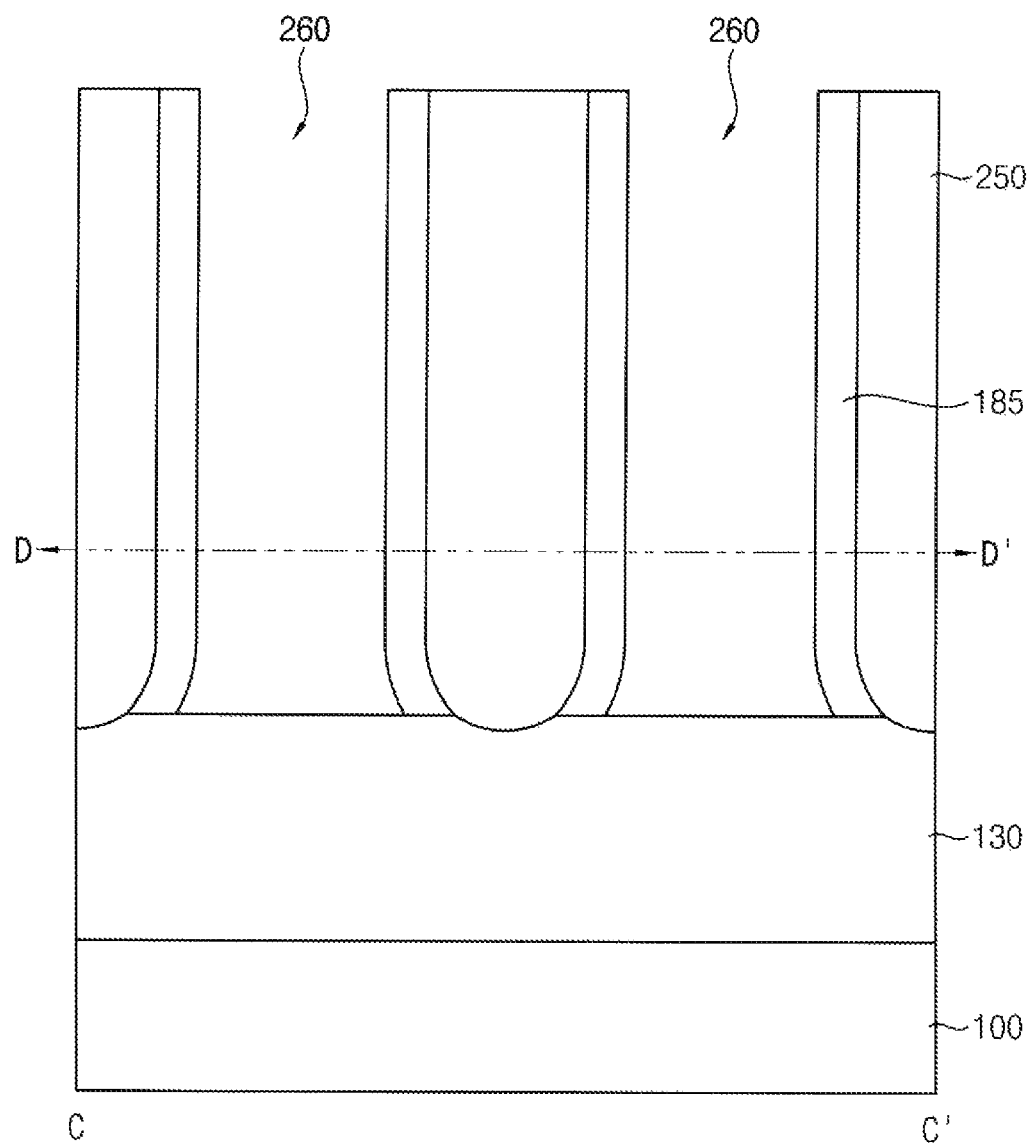

FIGS. 7, 9 and 12 are cross-sectional views taken along lines A-A' of corresponding plan views, FIGS. 13, 17, 21, 26, 28 and 31 are cross-sectional views taken along lines B-B' of corresponding plan views, and FIGS. 14, 18 and 32 are cross-sectional views taken along lines C-C' of corresponding plan views. FIGS. 11, 16, 20, 23, 25 and 30 are horizontal cross-sectional views of regions X of corresponding plan views, which may be taken along lines D-D' of the corresponding plan views.

Figure 6:
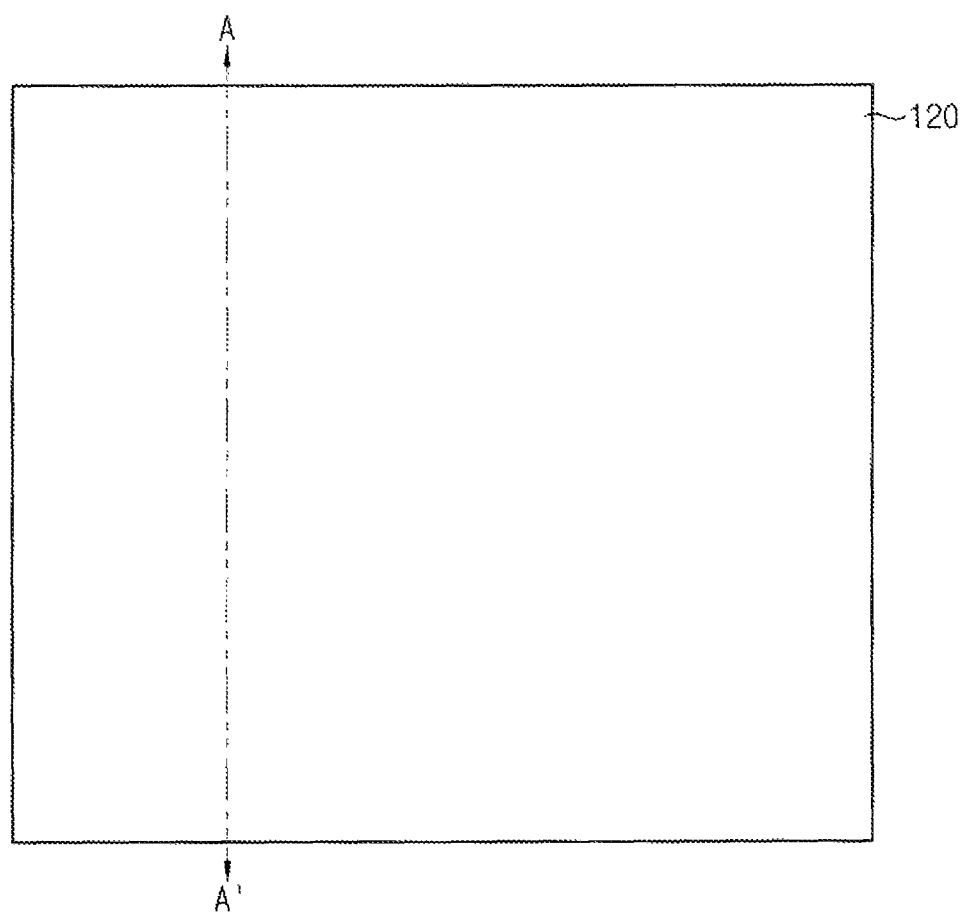
FIGS. 6 to 32 include plan views and cross-sectional views illustrating a method of manufacturing a semiconductor device in accordance with example embodiments. In particular.

Referring to FIGS. 6 and 7, a sacrificial layer 110 and a semiconductor layer 120 may be alternately stacked on a substrate 100.

In the figures, three sacrificial layers 110 and three semiconductor layers 120 are shown to be formed on the substrate 100. The inventive concepts, however, are not limited thereto.

The sacrificial layer 110 may include a material having an etching selectivity with respect to the substrate 100 and the semiconductor layer 120, which may include, e.g., silicon-germanium.

Figure 8:
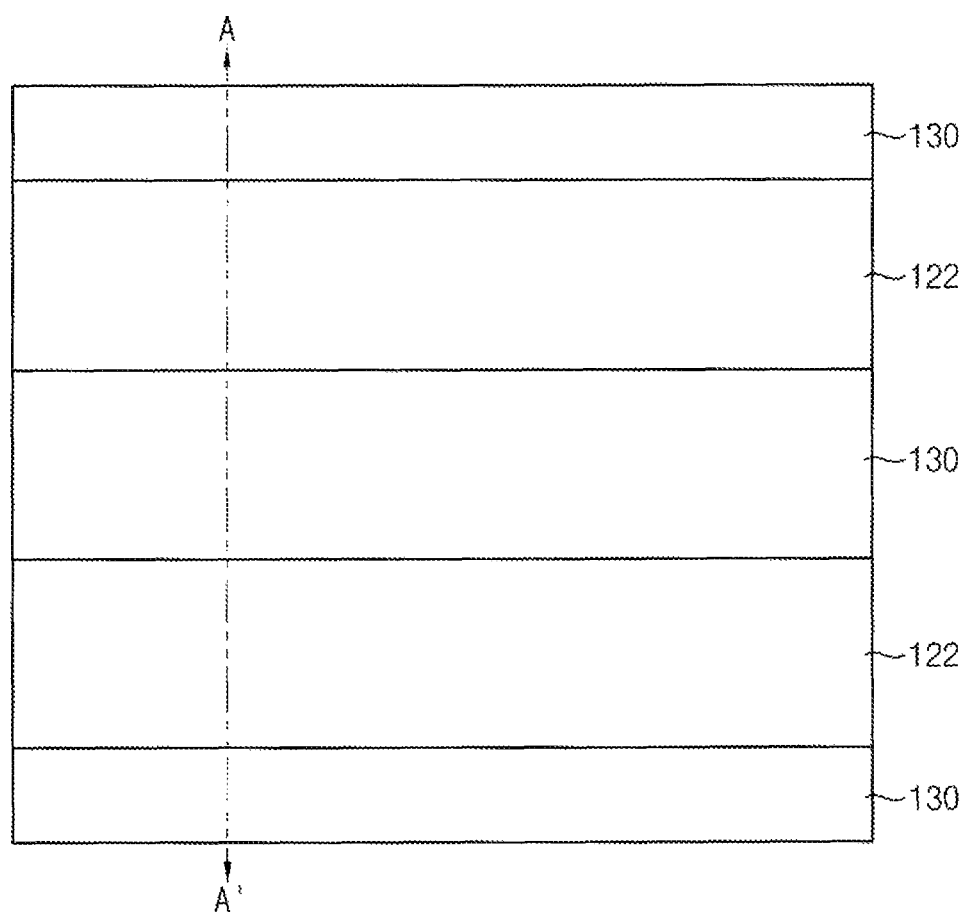

Referring to FIGS. 8 and 9, a hard mask may be formed on an uppermost one of the semiconductor layers 120 to extend in the first direction, and the semiconductor layers 120, the sacrificial layers 110, and an upper portion of the substrate 100 may be etched using the hard mask as an etching mask.

Thus, an active region 105 may be formed on the substrate 100 to extend in the first direction, and a fin structure including sacrificial lines 112 and semiconductor lines 122 alternately and repeatedly stacked may be formed on the active region 105. In example embodiments, a plurality of fin structures may be formed to be spaced apart from each other in the second direction on the substrate 100.

After removing the hard mask, an isolation pattern 130 may be formed on the substrate 100 to cover a sidewall of the active region 105.

Referring to FIGS. 10 to 14, a dummy gate structure 175 may be formed on the substrate 100 to partially cover the fin structure and the isolation pattern 130.

Particularly, a dummy gate insulation layer, a dummy gate electrode layer, and a dummy gate mask layer may be sequentially formed on the substrate 100 having the fin structure and the isolation pattern 130 thereon, a photoresist pattern may be formed on the dummy gate mask layer, and the dummy gate mask layer may be etched using the photoresist pattern as an etching mask to form a dummy gate mask 165.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate electrode layer and the dummy gate insulation layer may be etched using the dummy gate mask 165 as an etching mask to form a dummy gate electrode 155 and a dummy gate insulation pattern 145, respectively.

The dummy gate insulation pattern 145, the dummy gate electrode 155, and the dummy gate mask 165 sequentially stacked on the active region 105 and a portion of the isolation pattern 130 adjacent thereto may form the dummy gate structure 175. In example embodiments, the dummy gate structure 175 may extend in the second direction to cover an upper surface and opposite sidewalls in the second direction of the fin structure and a portion of the isolation pattern 130 adjacent the fin structure in the second direction.

In example embodiments, portions of the dummy gate structure 175 contacting a surface of the fin structure and an upper surface of the isolation pattern 130 may have a sidewall that is not perpendicular to, but rather is slanted relative to, the surface of the fin structure or the upper surface of the isolation pattern 130. That is, during the etching process for forming the dummy gate structure 175, the dummy gate insulation layer under the dummy gate electrode layer and contacting the surface of the fin structure or the upper surface of the isolation pattern 130 may not be easily etched due to the difference of the amount of etching gas or the materials, and thus may have the slanted sidewall with respect to the surface of the fin structure or the upper surface of the isolation pattern 130.

In example embodiments, a portion of the dummy gate insulation pattern 145 not overlapping the overlying dummy gate electrode 155 in the third direction may be formed on each of opposite sidewalls of the fin structure in the second direction, which may be referred to as a protrusion portion 145a of the dummy gate insulation pattern 145.

Referring to FIGS. 15 to 18, a second spacer 185 may be formed on a sidewall of the dummy gate structure 175.

Particularly, a second spacer layer may be formed on the substrate 100 having the fin structure, the isolation pattern 130, and the dummy gate structure 175 thereon, and may be anisotropically etched to form the second spacer 185 covering each of opposite sidewalls of the dummy gate structure 175 in the first direction.

The fin structure may be etched using the dummy gate structure 175 and the second spacer 185 as an etching mask to expose an upper surface of the active region 105 of the substrate 100.

Thus, the sacrificial lines 112 and the semiconductor lines 122 under the dummy gate structure 175 and the second spacer 185 may be transformed into sacrificial patterns 114 and semiconductor patterns 124, respectively, and the fin structure may be divided into a plurality of parts spaced apart from each other in the first direction. In example embodiments, each of the semiconductor patterns 124 may serve as a channel of a transistor.

Hereinafter, the dummy gate structure 175, the second spacer 185 on each of opposite sidewalls of the dummy gate structure 175, and the fin structure under the dummy gate structure 175 and the second spacer 185 may be referred to as a first structure. In example embodiments, the first structure may extend in the second direction, and a plurality of first structures may be formed to be spaced apart from each other in the first direction. A first opening 190 may be formed between the first structures to expose the active region 105 and the isolation pattern 130.

In example embodiments, the protrusion portion 145a of the dummy gate insulation pattern 145 may be covered by the second spacer 185.

Figure 19:
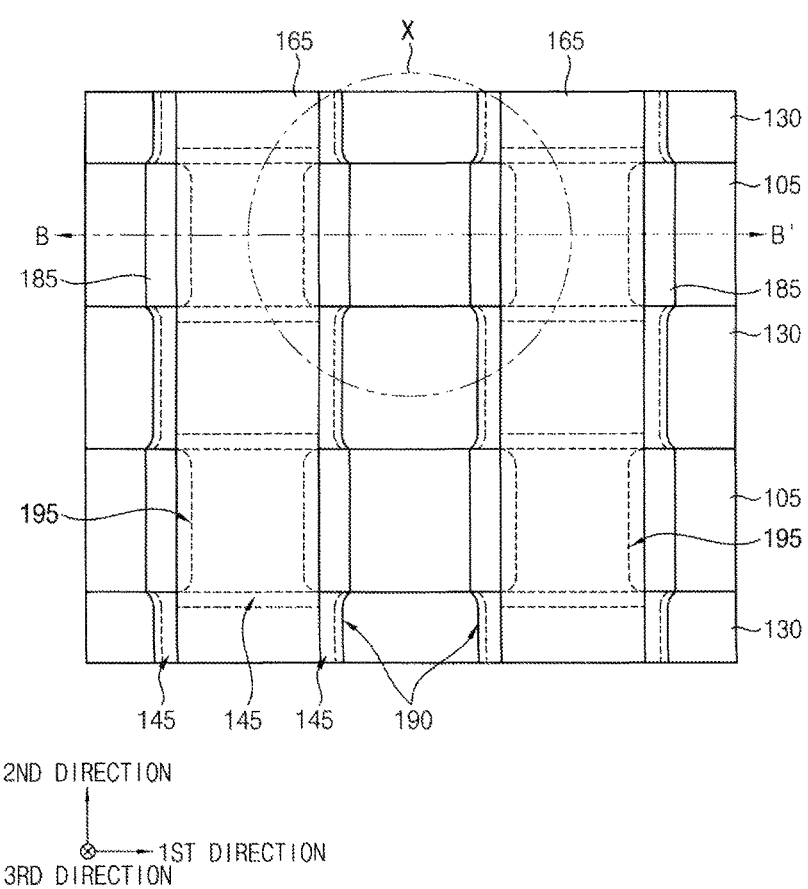
Figure 20:
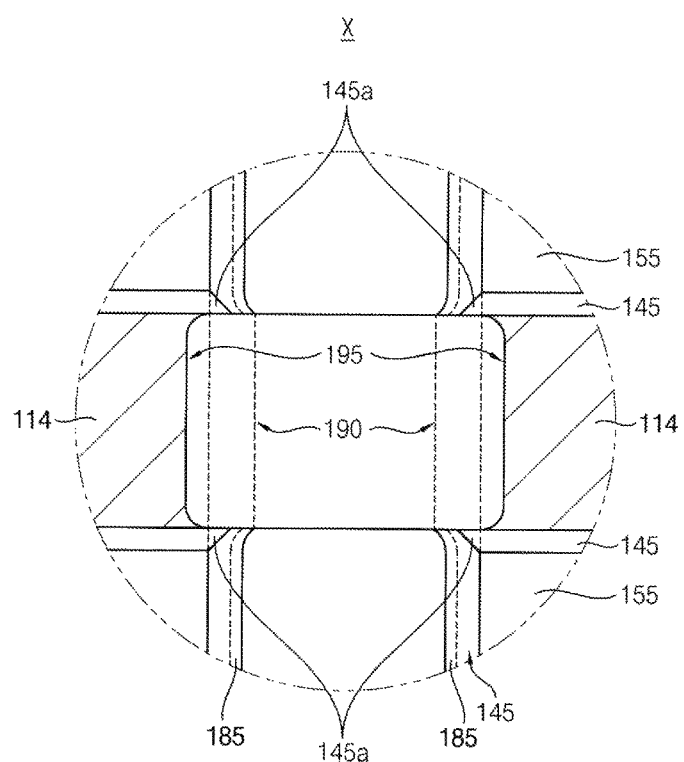
Figure 21:
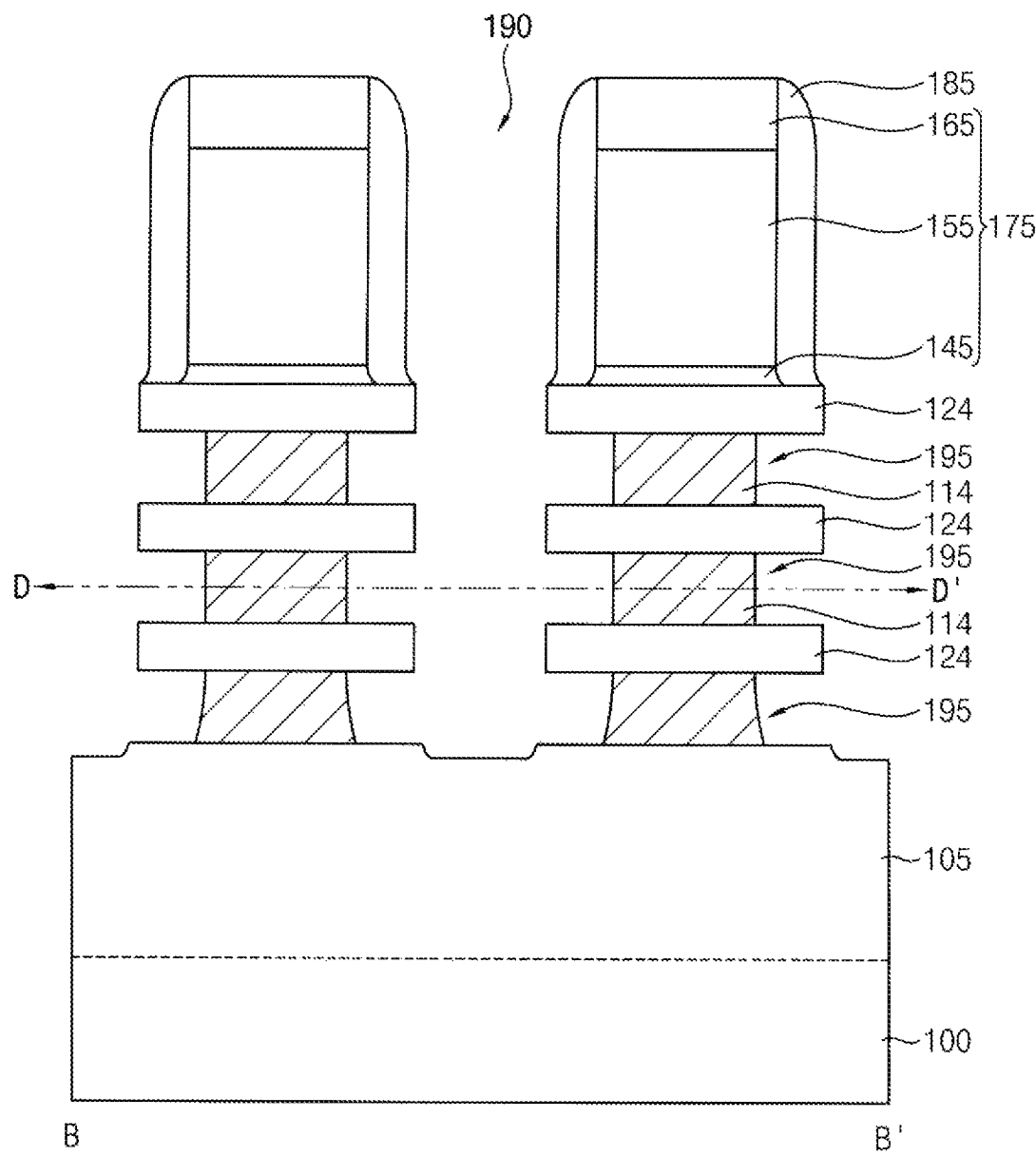

Referring to FIGS. 19 to 21, opposite sidewalls in the first direction of the sacrificial patterns 114 exposed by the first opening 190 may be etched to form first recesses 195, respectively.

In example embodiments, the first recesses 195 may be formed by a wet etching process on the sacrificial patterns 114. Alternatively, the first recesses 195 may be formed by a dry etching process on the sacrificial patterns 114.

In example embodiments, as the first recesses 195 are formed, the protrusion portion 145a of the dummy gate insulation pattern 145 protruding in the second direction from each of opposite ends of the sacrificial pattern 114 in the first direction may be exposed. In some example embodiments, as the first recesses 195 are formed, a width in the first direction of the sacrificial pattern 114 may be less than that of the overlying dummy gate structure 175. The inventive concepts, however, are not limited thereto. That is, if only the protrusion portion 145a of the dummy gate insulation pattern 145 may be exposed by the formation of the first recesses 195, the depth of each of the first recesses 195 may not be limited, and thus the width in the first direction of the sacrificial pattern 114 may be equal to or more than that of the overlying dummy gate structure 175.

Figure 22:
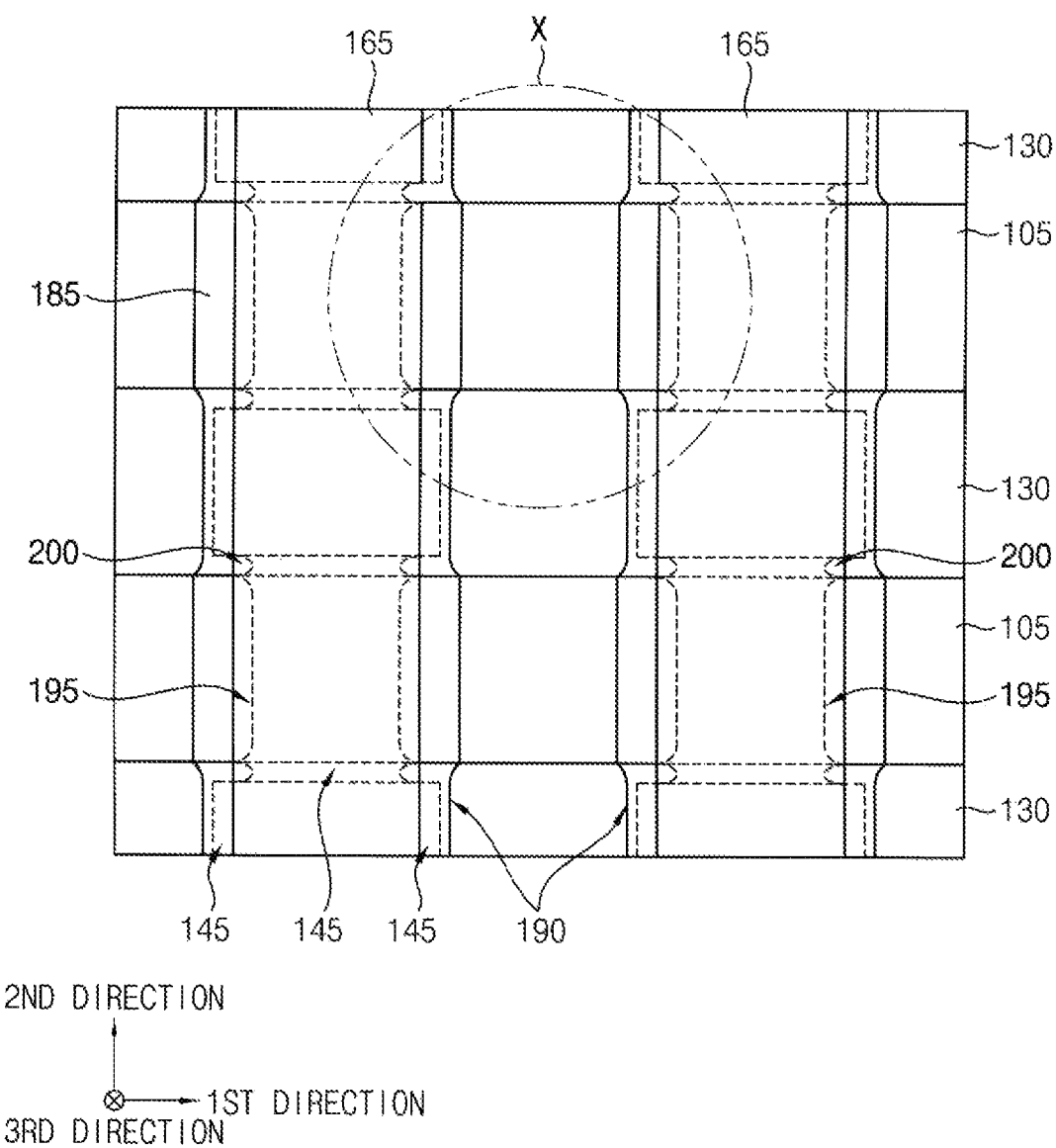
Figure 23:
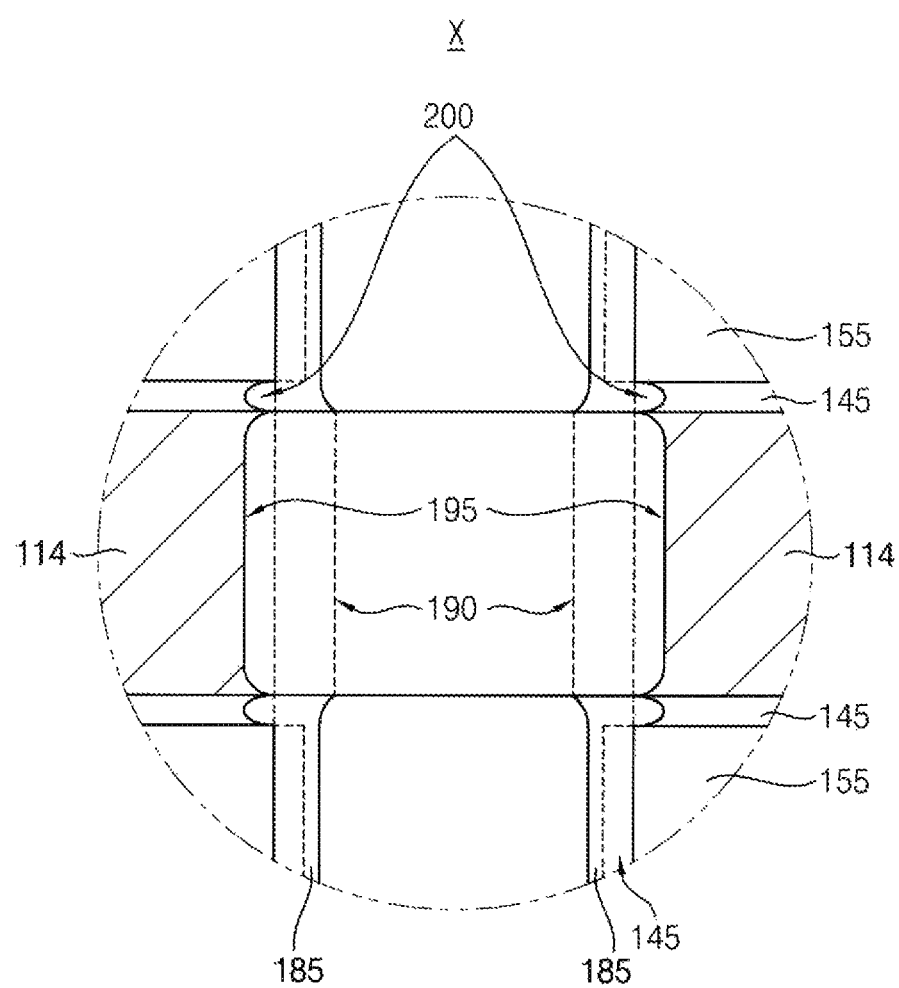

Referring to FIGS. 22 and 23, the protrusion portion 145a of the dummy gate insulation pattern 145 exposed by the first recesses 195 may be removed to form a second recess 200.

In example embodiments, the second recess 200 may be formed by a wet etching process on the dummy gate insulation pattern 145. Alternatively, the second recess 200 may be formed by a dry etching process on the dummy gate insulation pattern 145.

In example embodiments, during the etching process, not only the protrusion portion 145a of the dummy gate insulation pattern 145 exposed by the first recesses 195 but also a portion of the dummy gate insulation pattern 145 adjacent the protrusion portion 145a, i.e., a portion of the dummy gate insulation pattern 145 overlapping the overlying dummy gate electrode 155 in the third direction may be removed.

Figure 24:
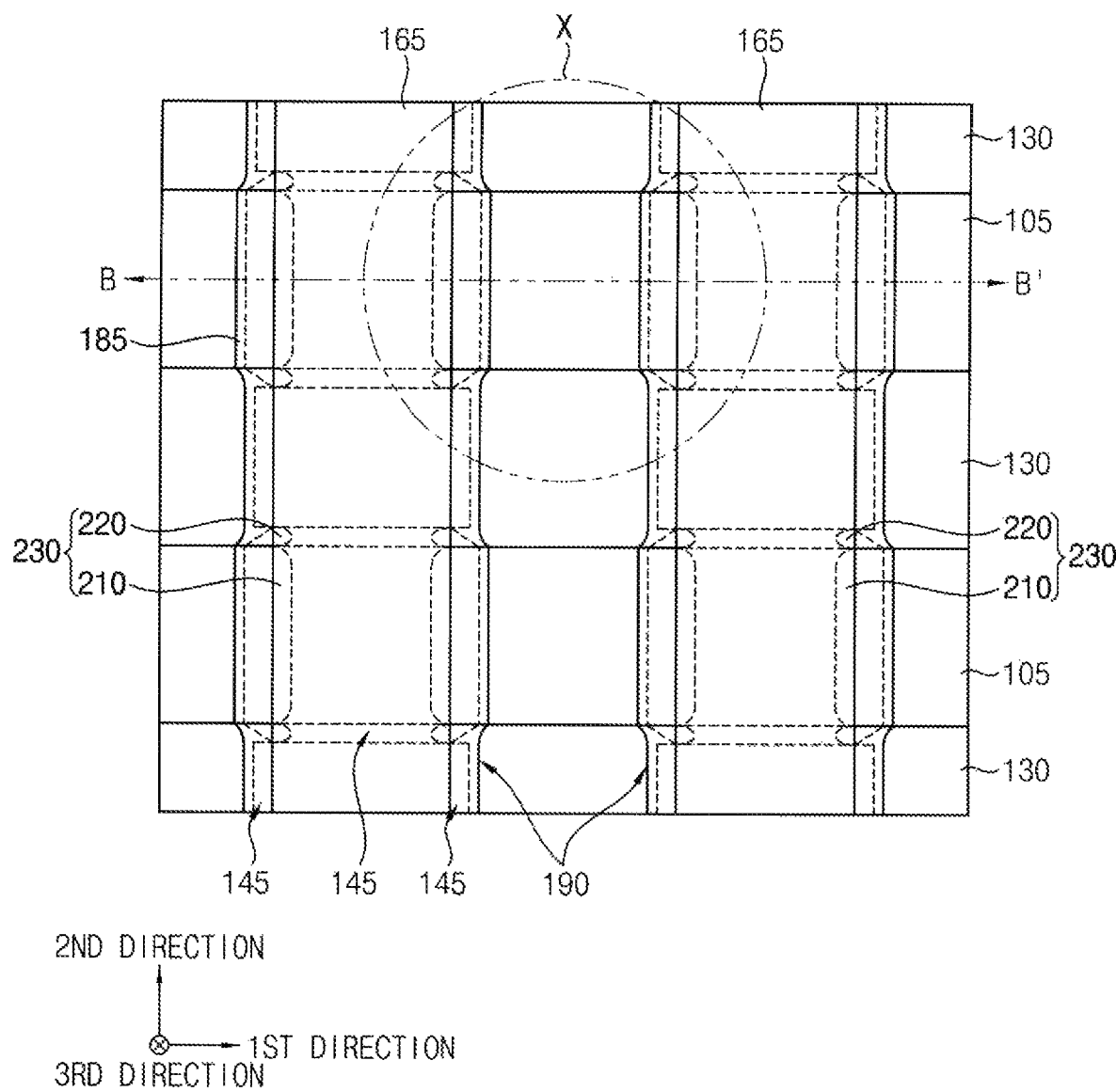
Figure 25:
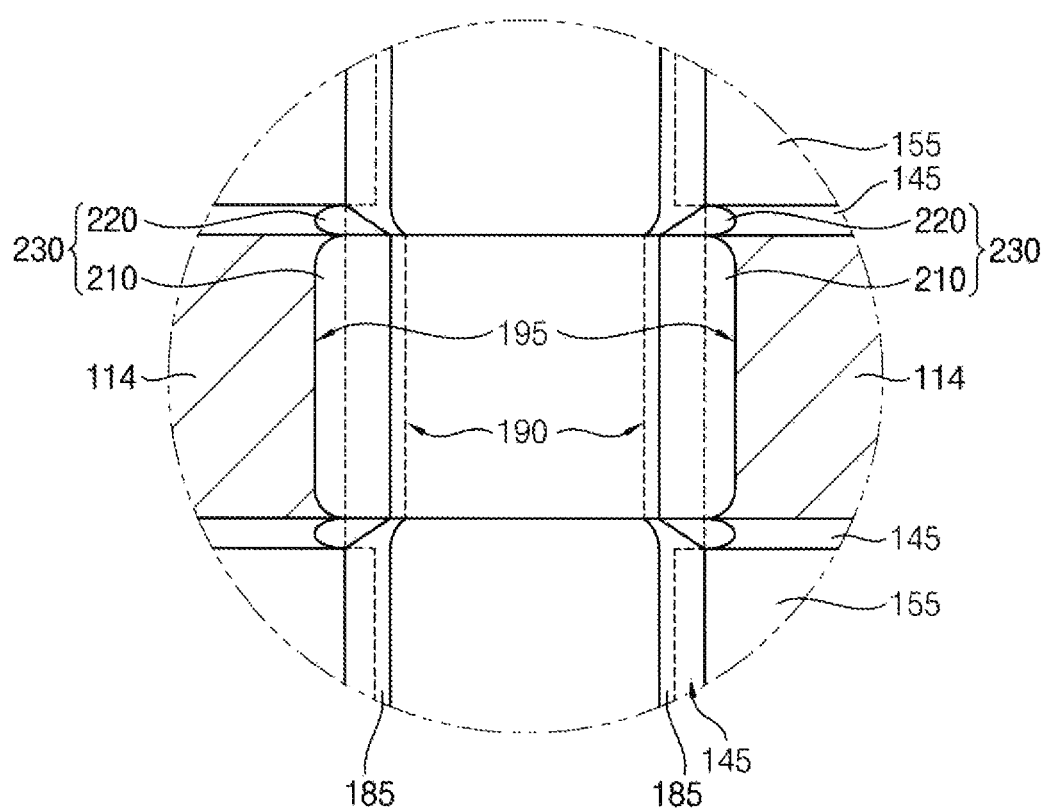
Figure 26:
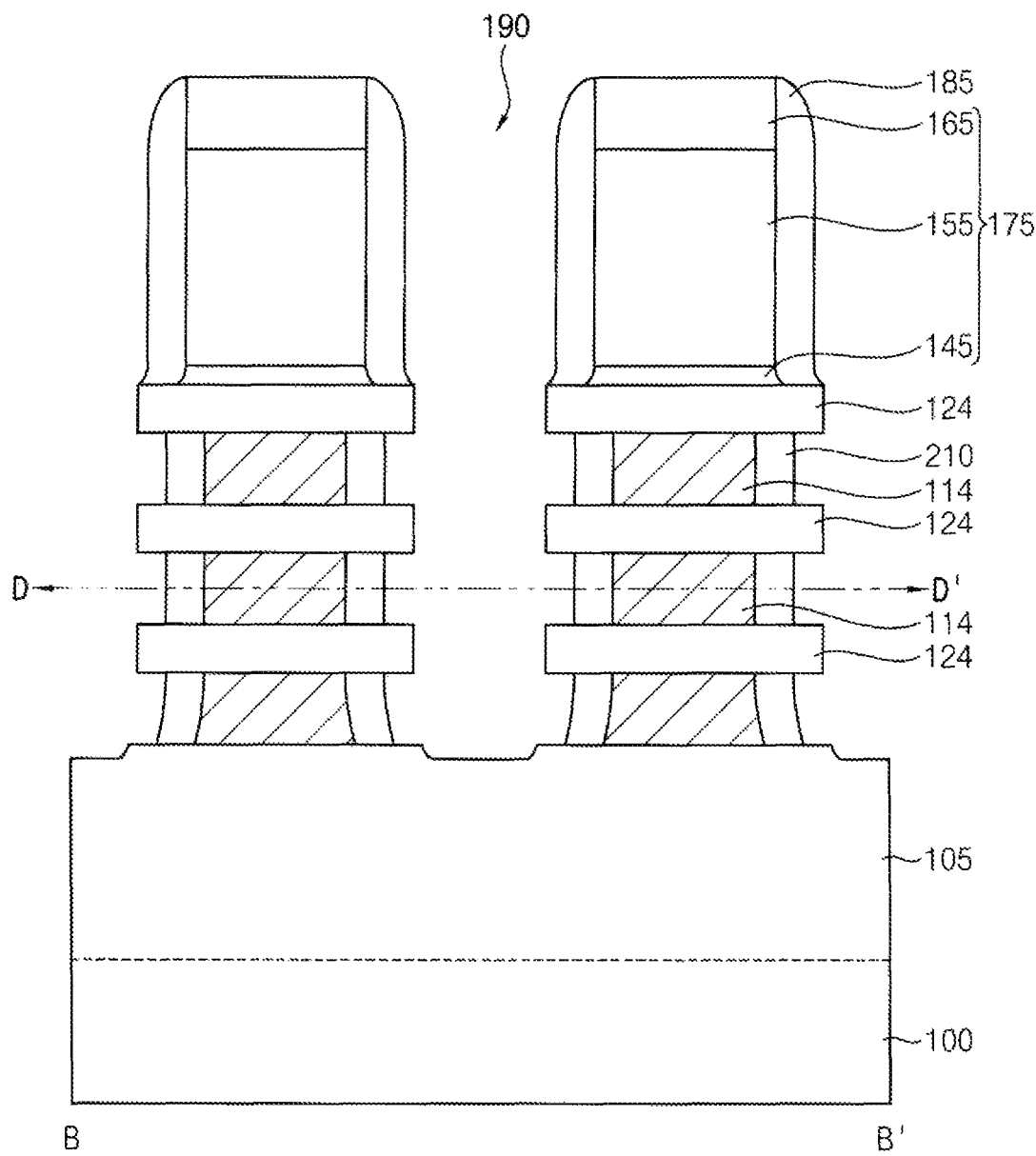
Figure 26:
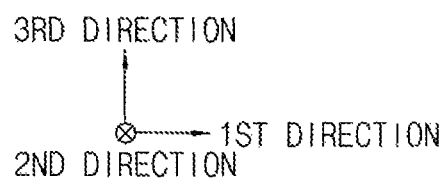

Referring to FIGS. 24 to 26, a first spacer 230 may be formed to fill the first and second recesses 195 and 200.

The first spacer 230 may be formed by forming a first spacer layer on the dummy gate structure 175, the second spacer 185, the fin structure, the active region 105 of the substrate 100, and the isolation pattern 130 to fill the first and second recesses 195 and 200, and anisotropically etching the first spacer layer. The first spacer layer may be formed by a deposition process, e.g., a chemical vapor deposition (CVD) process, an atomic layer deposition (ALD) process, etc.

In example embodiments, the first spacer 230 may include a central portion 210 filling the first recess 195 and a protrusion portion 220 filling the second recess 200. That is, the protrusion portion 220 of the first spacer 230 may protrude in the second direction from each of opposite ends of the central portion 210 in the second direction, and the protrusion portions 220 at opposite ends of the central portion 210 may be symmetric with each other.

In example embodiments, the first spacer 230 may at least partially overlap the overlying second spacer 185 in the third direction. In the figures, an outer sidewall of the central portion 210 of the first spacer 230 is not aligned with an outer sidewall of the second spacer 185 in the third direction. The inventive concepts, however, are not limited thereto.

Figure 27:
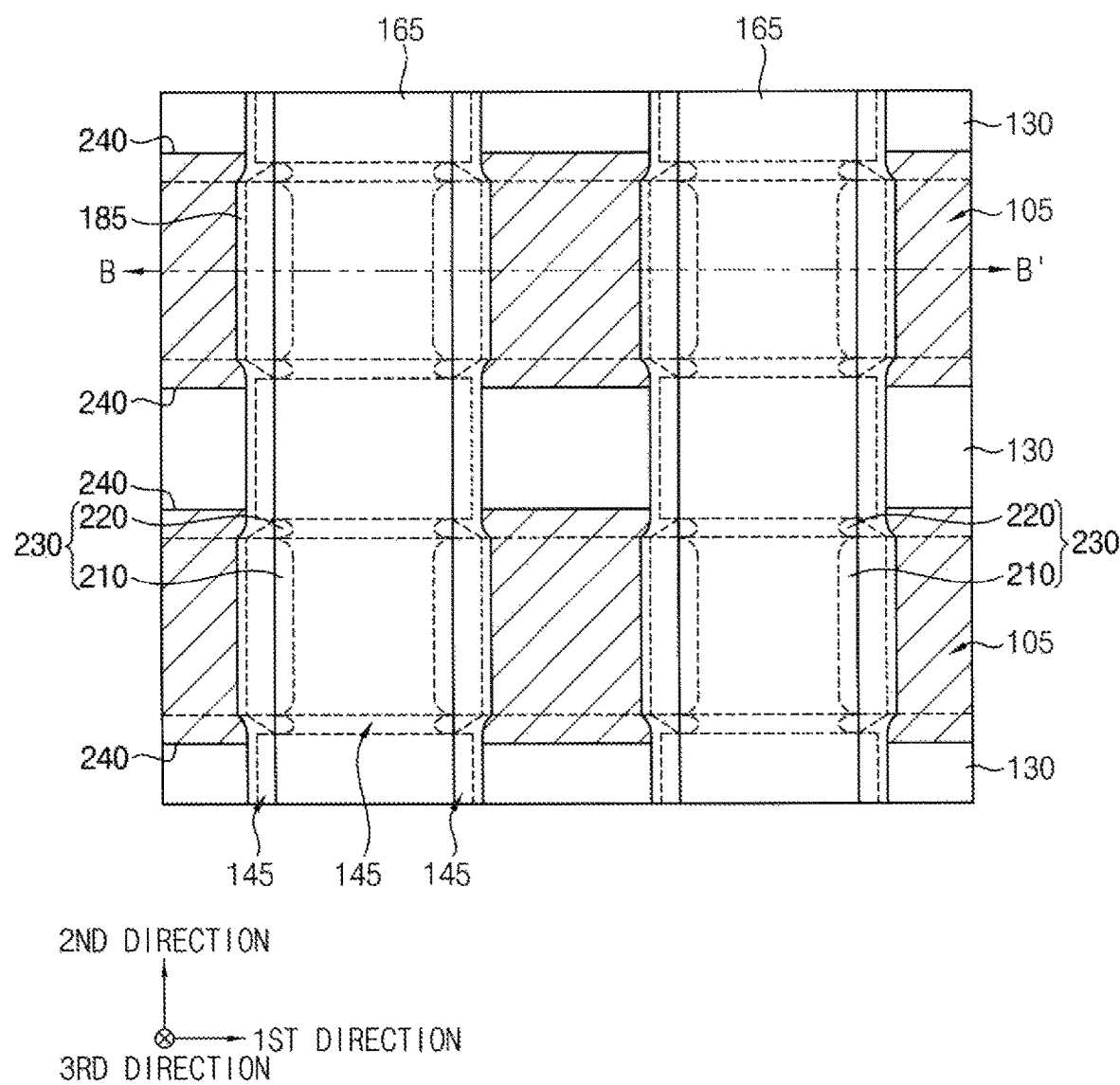
Figure 28:
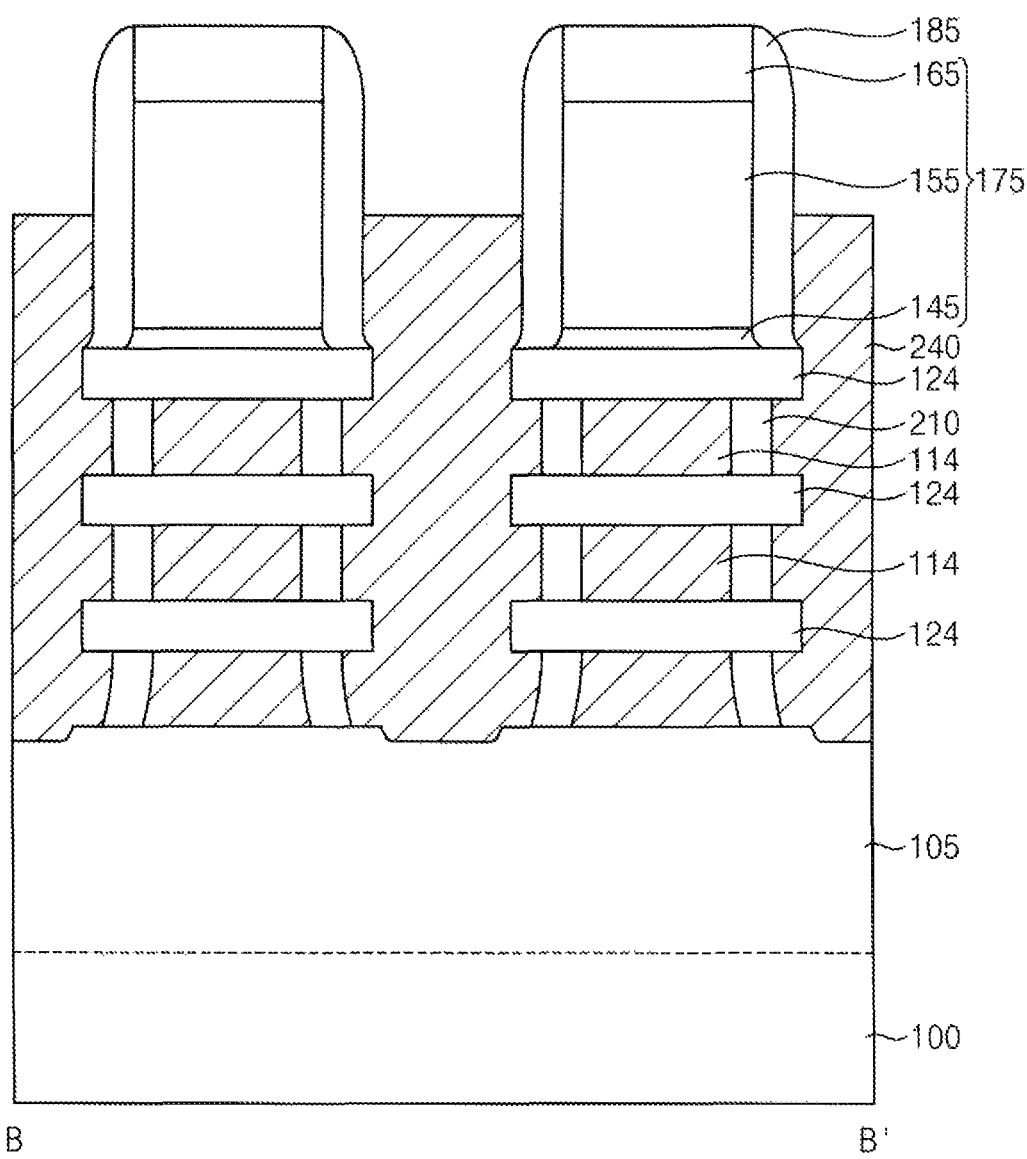
Figure 29:
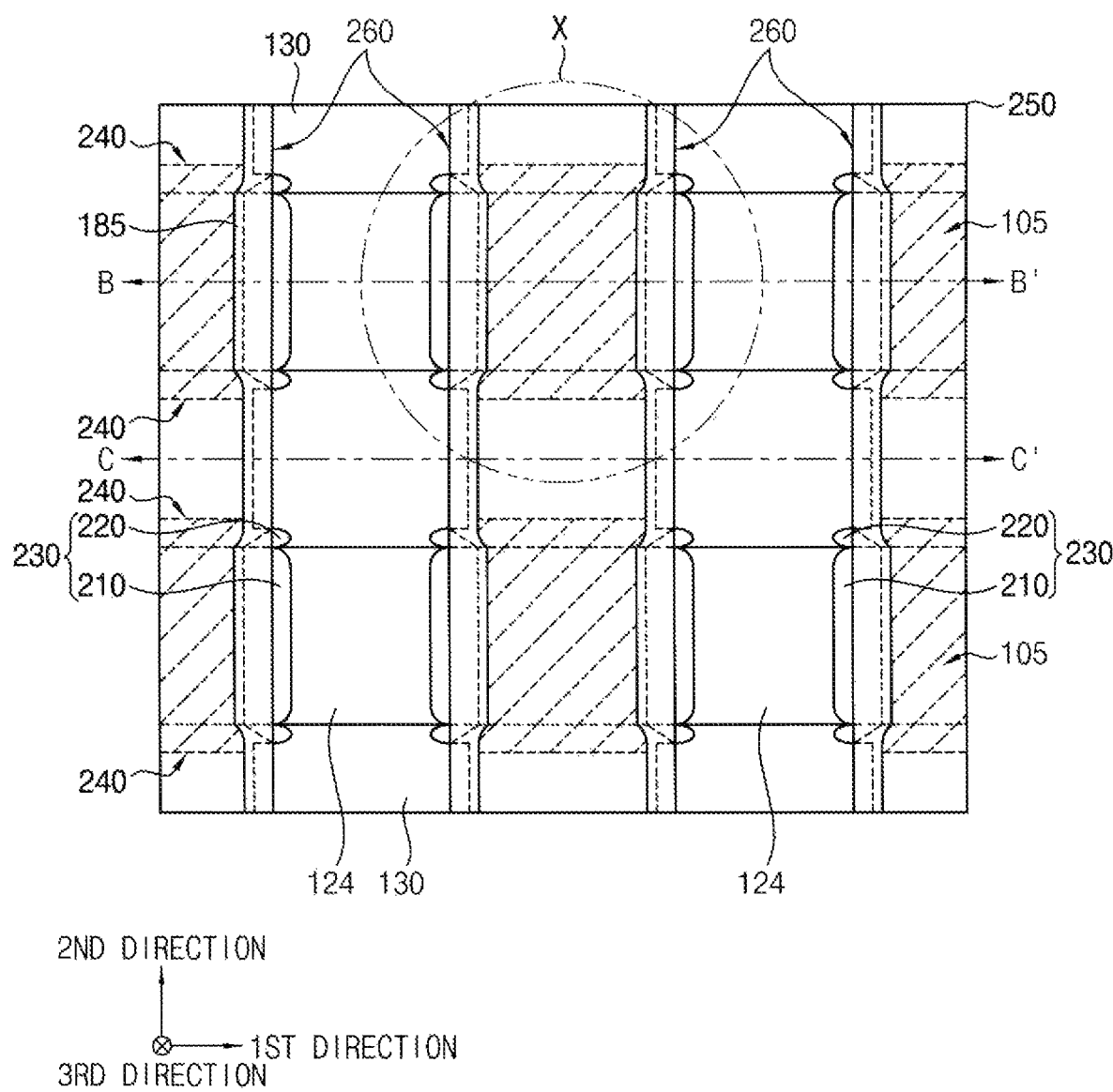
Figure 30:
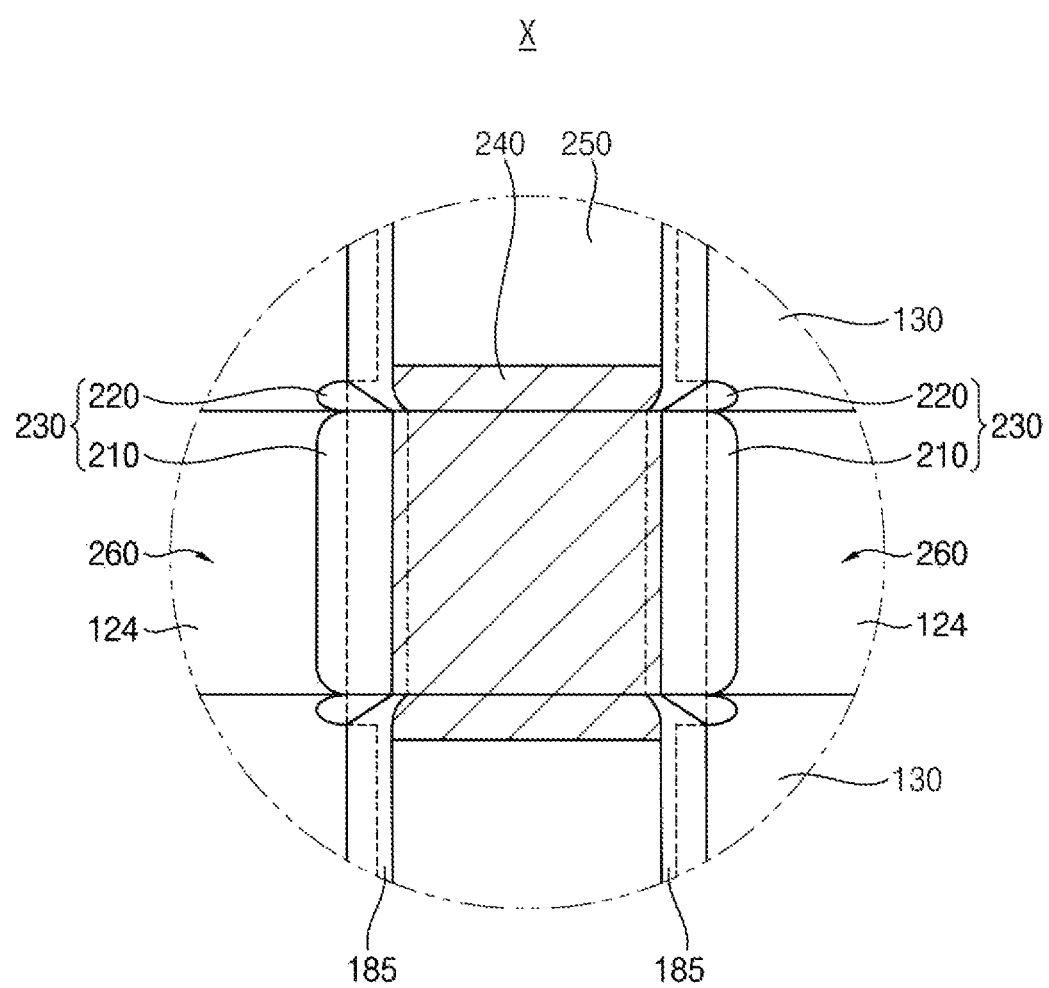
Figure 31:
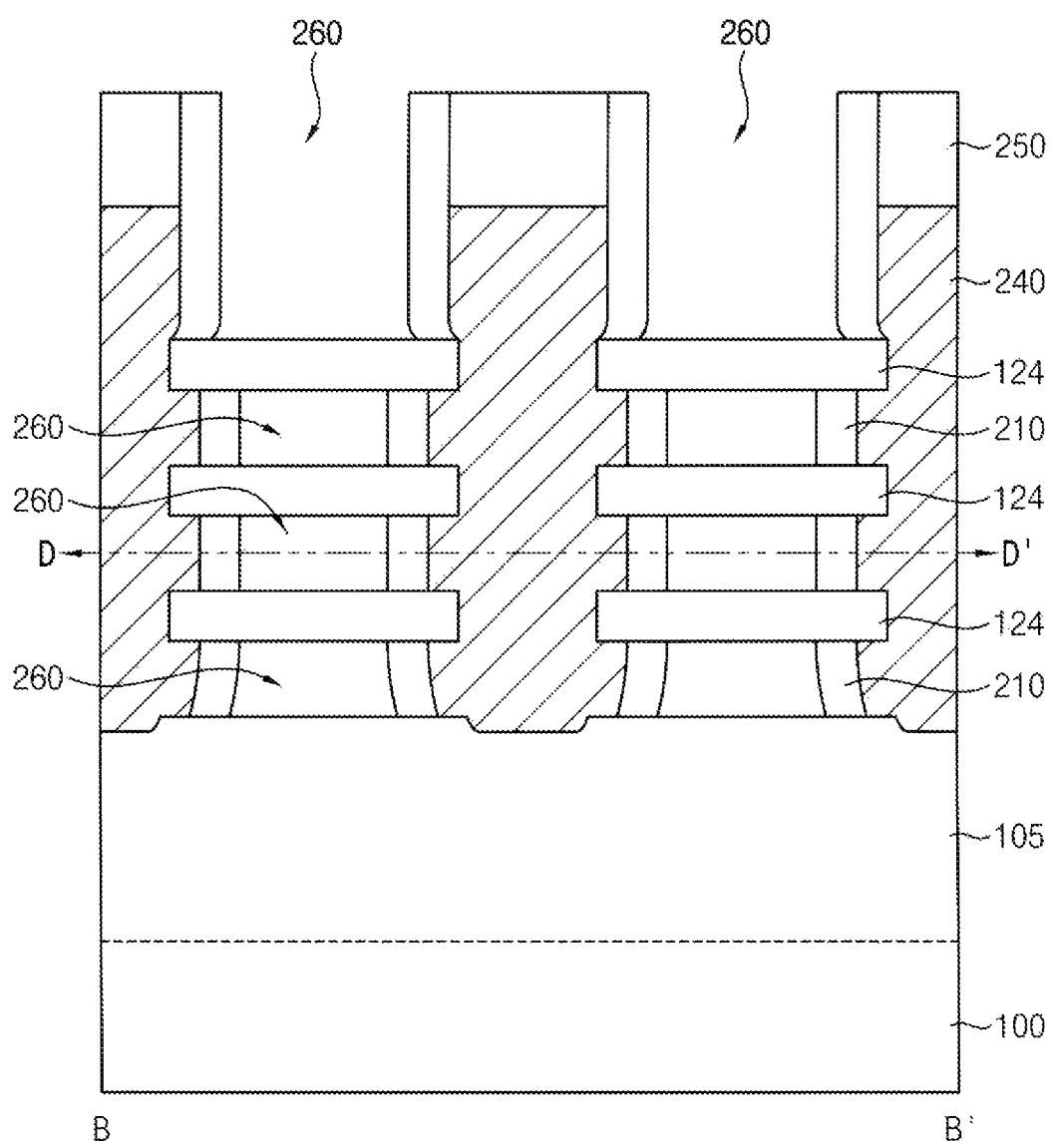

Referring to FIGS. 27 and 28, an epitaxial layer 240 may be formed on the upper surface of the active region 105 of the substrate 100 exposed by the first opening 190.

In example embodiments, the epitaxial layer 240 may be formed by a selective epitaxial growth (SEG) process using the exposed upper surface of the active region 105 by the first opening 190 as a seed.

In example embodiments, the SEG process may be performed using a silicon source gas such as disilane ($Si_2H_6$) and a carbon source gas such as $SiH_3CH_3$, to form a single crystalline silicon carbide (SiC) layer. In some example embodiments, the SEG process may be performed using only the silicon source gas such as disilane ($Si_2H_6$), to form a single crystalline silicon layer. The epitaxial layer 240 may serve as a source/drain layer of an NMOS transistor.

Alternatively, the SEG process may be performed, using a silicon source gas such as dichlorosilane ($SiH_2Cl_2$) and a germanium source gas such as germane ($GeH_4$), to form a single crystalline silicon germanium (SiGe) layer. The epitaxial layer 240 may serve as a source/drain layer of a PMOS transistor.

In example embodiments, the epitaxial layer 240 may be formed on each of opposite sidewalls of the first structure in the first direction. In example embodiments, the epitaxial layer 240 may contact sidewalls of the semiconductor patterns 124 of the fin structure, and outer sidewalls of the first spacer 230 covering sidewalls of the sacrificial patterns 114, and further grow in the third direction to contact a sidewall of the second spacer 185.

In some embodiments, the epitaxial layer 240 may be formed by a laser epitaxial growth (LEG) process or a solid phase epitaxy (SPE) process.

The epitaxial layer 240 may serve as a source/drain layer of a transistor. An impurity doping process and a heat treatment process may be further performed on the epitaxial layer 240. For example, when the epitaxial layer 240 includes silicon carbide or silicon, n-type impurities may be doped thereinto and a heat treatment may be performed. When the epitaxial layer 240 includes silicon-germanium, p-type impurities may be doped thereinto and a heat treatment may be performed.

Referring to FIGS. 29 to 32, an insulation layer 250 may be formed on the substrate 100 to cover the first structure and the epitaxial layer 240, and may be planarized until upper surfaces of the dummy gate electrode 155 of the first structure may be exposed. During the planarization process, the dummy gate mask 165 may be also removed, and an upper portion of the second spacer 185 may be removed.

The planarization process may be performed by a chemical mechanical polishing (CMP) process and/or an etch back process.

The exposed dummy gate electrode 155 and the dummy gate insulation pattern 145 may be removed by, e.g., a wet etching process and/or a dry etching process to form a second opening 260 exposing an inner sidewall of the second spacer 185, an inner sidewall of the first spacer 230, surfaces of the semiconductor patterns 124, and the upper surface of the active region 105.

In example embodiments, the protrusion portion 145a of the dummy gate insulation pattern 145 has already been removed to be replaced with the protrusion portion 220 of the first spacer 230 including a material different, and thus the protrusion portion 220 of the first spacer 230 may not be removed in the etching process. Accordingly, the epitaxial layer 240 may not be exposed by the second opening 260.

Referring to FIGS. 1 to 5 again, a gate structure 310 may be formed on the substrate 100 to fill the second opening 260.

Particularly, after a thermal oxidation process is performed on the upper surface of the active region 105 and the surface of the semiconductor pattern 124 exposed by the second opening 260 to form an interface pattern 270, a gate insulation layer and a workfunction control layer may be sequentially formed on a surface of the interface pattern 270, inner sidewalls of the first and second spacers 230 and 185, and an upper surface of the insulation layer 250, and a gate electrode layer may be formed to fill a remaining portion of the second opening 260.

The gate insulation layer, the workfunction control layer, and the gate electrode layer may be formed by, e.g., a CVD process, an ALD process, a PVD process, etc. The interface pattern 270 may be also formed by a CVD process, an ALD process, a PVD process, etc., instead of the thermal oxidation process, and in this case, the interface pattern 270 may be also formed on the inner sidewalls of the first and second spacers 230 and 185.

The gate electrode layer, the workfunction control layer, and the gate insulation layer may be planarized until the upper surface of the insulation layer 250 may be exposed to form a gate electrode 300, a workfunction control pattern 290, and a gate insulation pattern 280, respectively. The interface pattern 270, the gate insulation pattern 280, the workfunction control pattern 290, and the gate electrode 300 may form a gate structure 310.

In example embodiments, the gate structure 310 may be electrically insulated from the epitaxial layer 240 by the first spacer 230 including the protrusion portion 220 and the second spacer 185, and thus an electrical short may not occur therebetween.

Figure 33:
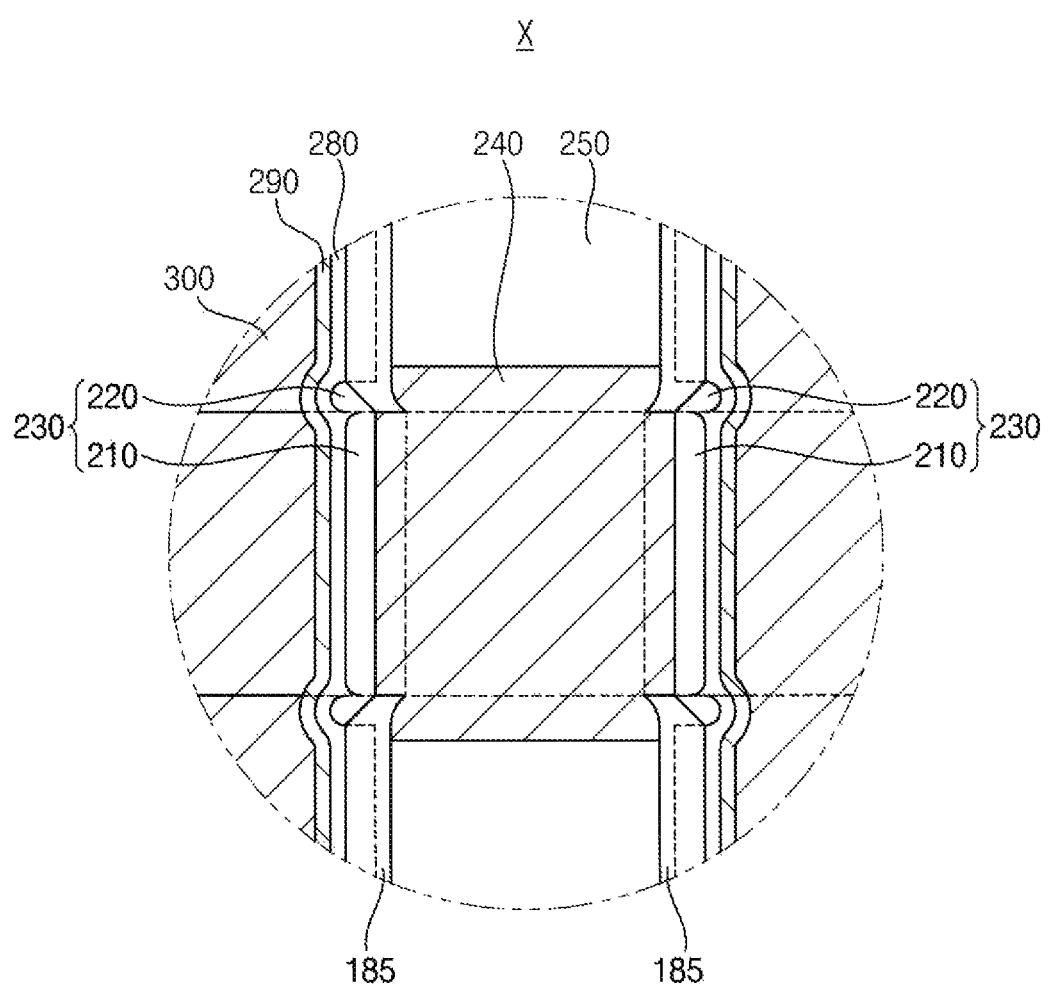
FIGS. 33 to 37 are cross-sectional views illustrating semiconductor devices in accordance with example embodiments.
Figure 34:
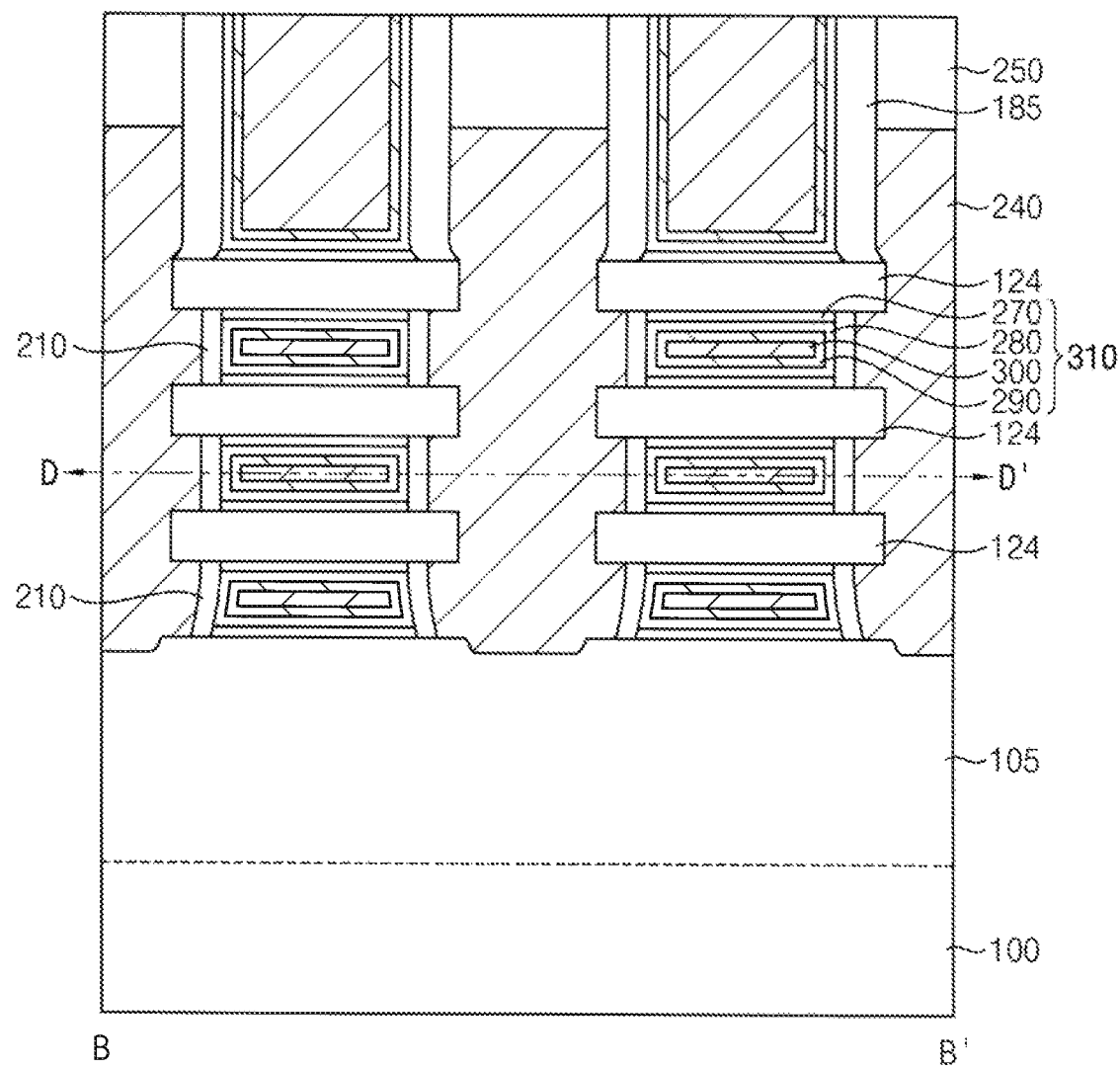
Figure 34:
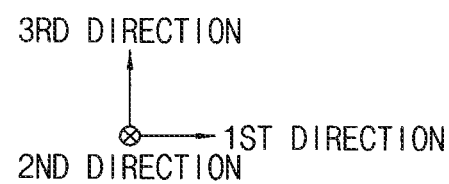
Figure 35:
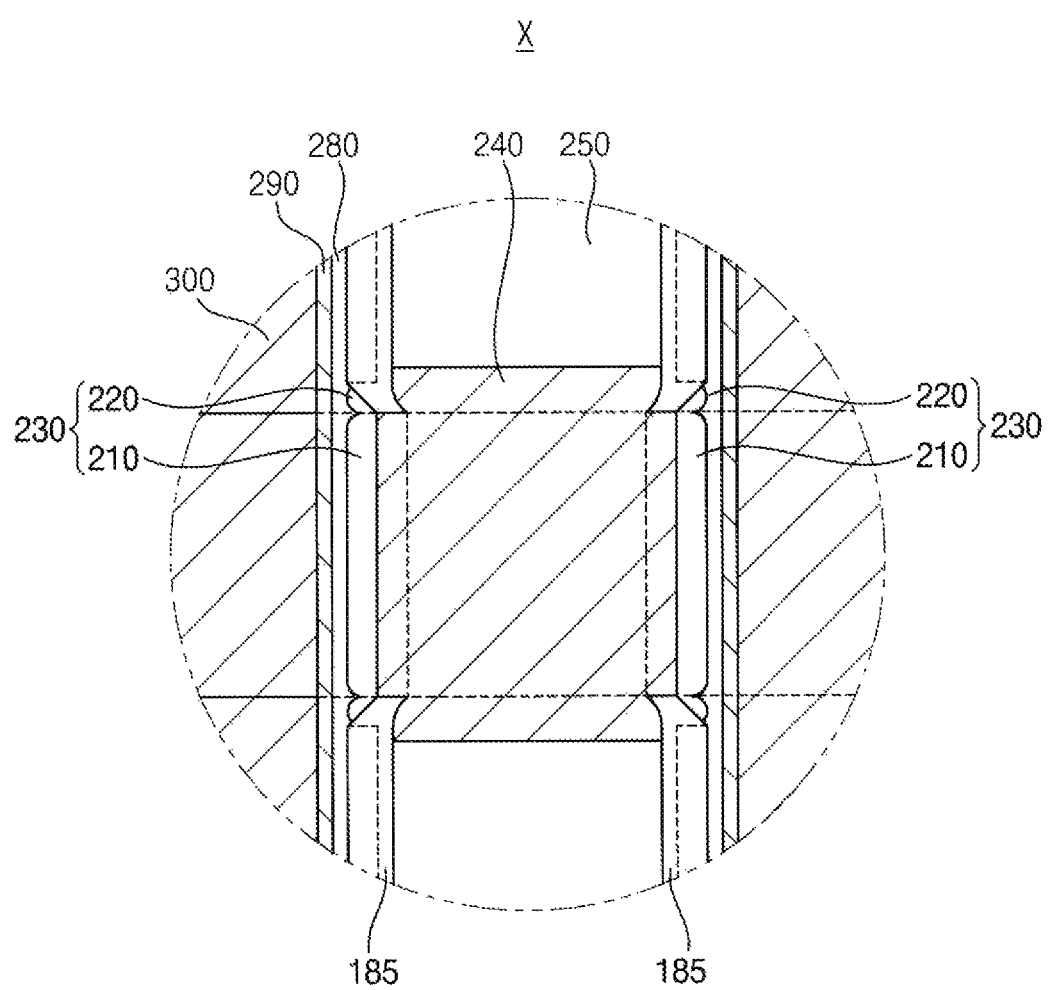
Figure 36:
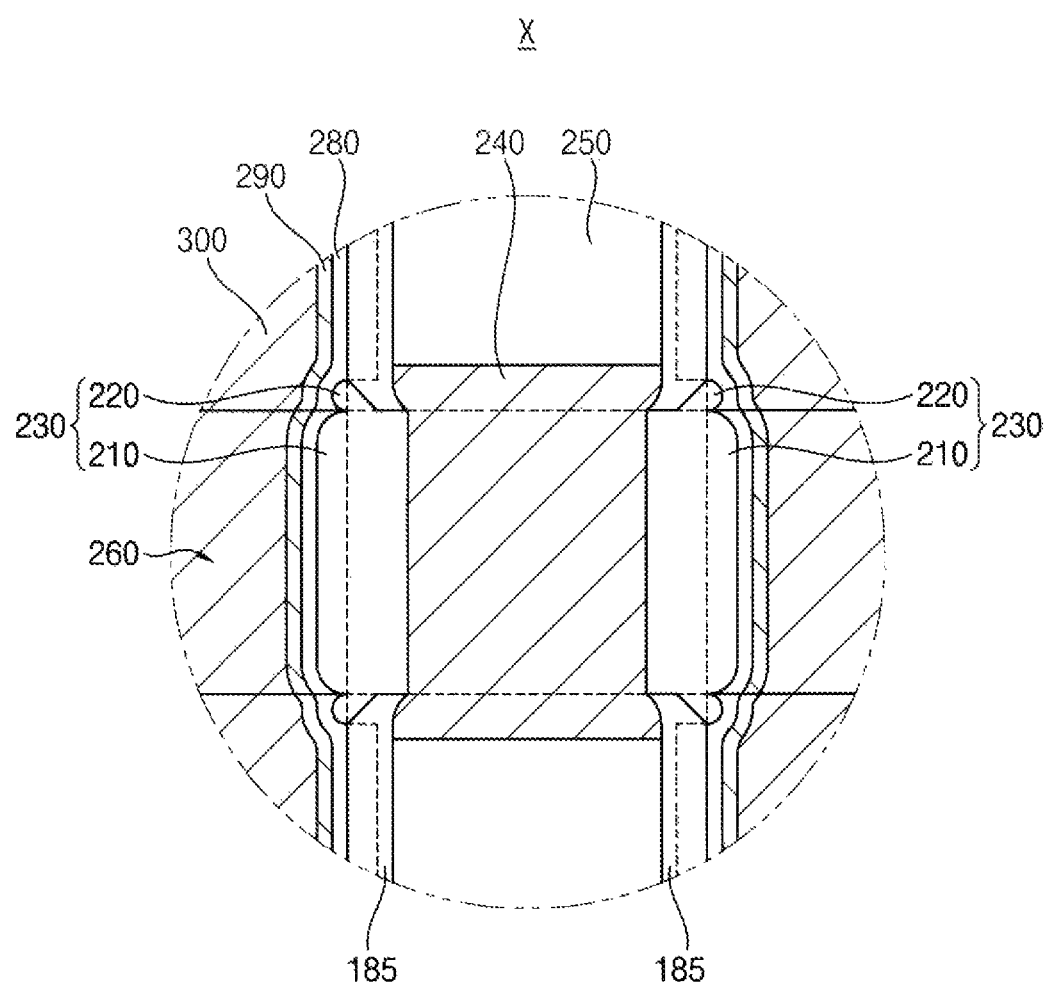

FIGS. 33 to 37 are cross-sectional views illustrating semiconductor devices in accordance with example embodiments. FIGS. 33, 35 and 36 are horizontal cross-sectional views of a region X of FIG. 1, which may be taken along lines D-D' of FIGS. 3 to 5, and FIGS. 34 and 37 are vertical cross-sectional views taken along a line B-B' of FIG. 1.

These semiconductor devices may be substantially the same as that of FIG. 1, except for the first spacer. Thus, like reference numerals refer to like elements, and repeated detailed descriptions thereon may be omitted herein.

Referring to FIGS. 33 and 34, unlike that of FIGS. 1 to 5, the inner sidewall of the central portion 210 of the first spacer 230 may be aligned with the inner sidewall of the second spacer 185 in the third direction. Thus, the width in the first direction of the portion of the gate structure 310 under the uppermost one of the semiconductor patterns 124 may be substantially equal to that of the portion of the gate structure 310 on/above the uppermost one of the semiconductor patterns 124.

Referring to FIG. 35, the protrusion portion 220 of the first spacer 230 may have an area smaller than that of the protrusion portion 220 of the first spacer 230 shown in FIGS. 34 and 35.

Figure 37:
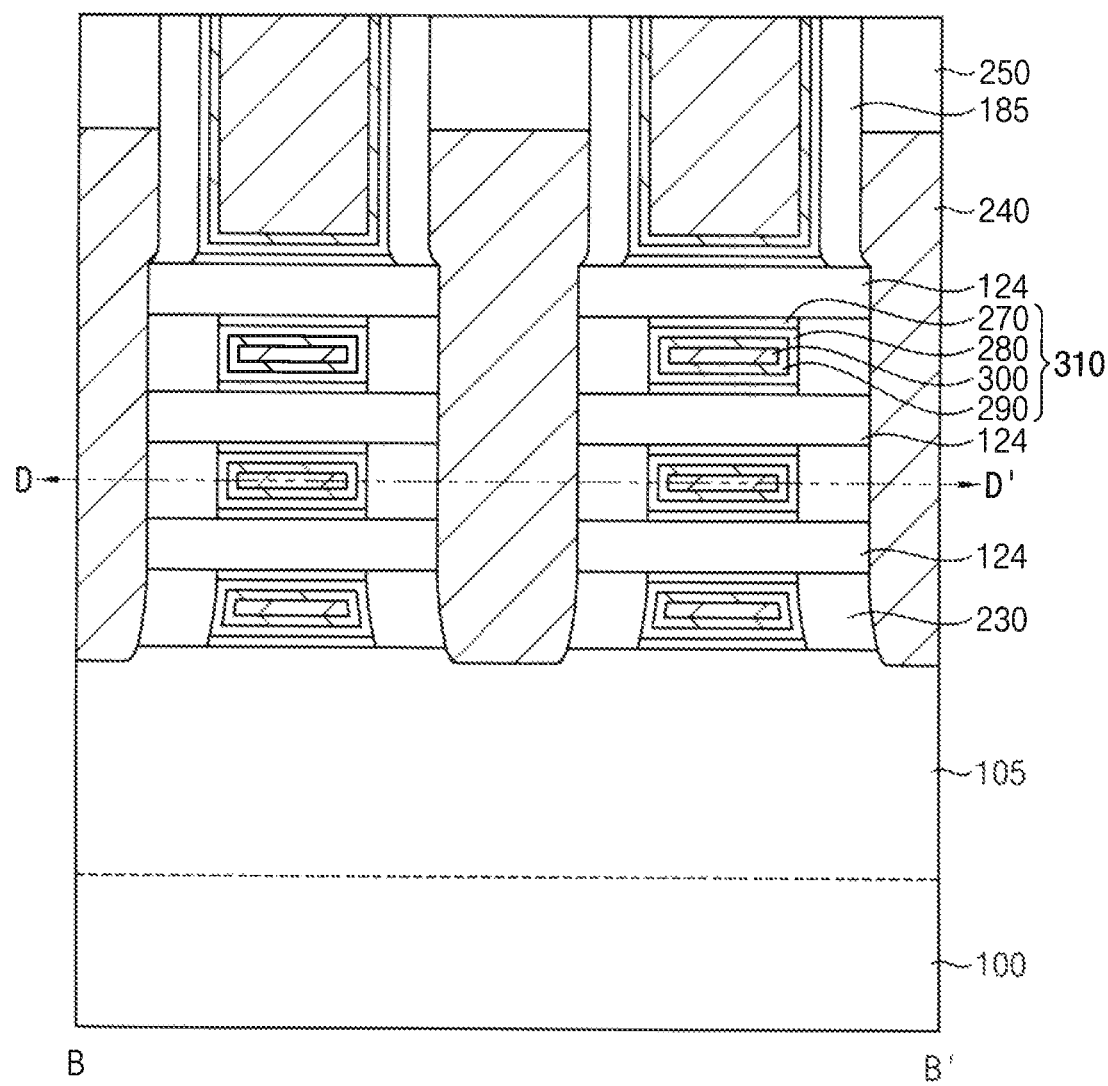
Figure 37:
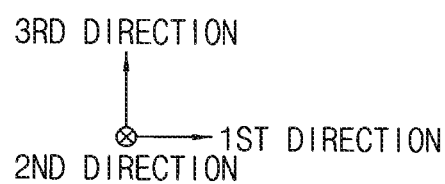

Referring to FIGS. 36 and 37, unlike that of FIGS. 1 to 5, the outer sidewall of the central portion 210 of the first spacer 230 may be aligned with the outer sidewall of the second spacer 185 in the third direction. Thus, a thickness of the first spacer 230 may be equal to or more than that of the second spacer 185.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
an active region protruding from a substrate in a vertical direction substantially perpendicular to an upper surface of the substrate, the active region extending in a first direction substantially parallel to the upper surface of the substrate;
channels spaced apart from each other in the vertical direction on an upper surface of the active region, each of the channels extending in the first direction;
a gate structure extending on the active region in a second direction substantially parallel to the upper surface of the substrate and substantially perpendicular to the first direction, the gate structure surrounding a central portion in the first direction of each of the channels and including a lower portion and an upper portion;
a first spacer on each of opposite sidewalls in the first direction of the lower portion of the gate structure;
a second spacer on each of opposite sidewalls in the first direction of the upper portion of the gate structure; and
a source/drain layer contacting each of opposite sidewalls in the first direction of the channels, each of opposite outer sidewalls in the first direction of the first spacer, and a lower portion of each of opposite outer sidewalls in the first direction of the second spacer,
wherein the first spacer at least partially overlaps the second spacer in the vertical direction, and includes:
a central portion in the second direction, the central portion overlapping the channels in the vertical direction; and
first and second protrusion portions protruding from opposite first and second ends, respectively, of the central portion in the second direction and not overlapping the channels in the vertical direction, the first and second protrusion portions being symmetric with each other in a plan view, and the central portion being longer in each of the first and second directions than each of the first and second protrusion portions, and
wherein a central portion in the first direction of a lower surface of the source/drain layer is lower than an edge portion in the first direction of the lower surface of the source/drain layer.

2. The semiconductor device of claim 1, wherein the gate structure is spaced apart and electrically insulated from the source/drain layer by the first and second spacers.

3. The semiconductor device of claim 1, wherein a first width in the first direction of the lower portion of the gate structure is narrower than a second width in the first direction of the upper portion of the gate structure.

4. The semiconductor device of claim 1, wherein the first spacer comprises at least one of silicon nitride, silicon carbonitride, silicon boron nitride, or silicon oxycarbonitride.

5. The semiconductor device of claim 1, wherein the first spacer comprises a plurality of first spacers spaced apart from each other in the vertical direction.

6. The semiconductor device of claim 1, wherein the gate structure comprises an interface pattern, a gate insulation pattern, a work function control pattern, and a gate electrode sequentially stacked on each of the channels.

7. A semiconductor device comprising:
a substrate;
channels spaced apart from each other in a vertical direction on an upper surface of the substrate, each of the channels extending in a first direction substantially parallel to the upper surface of the substrate;
a gate structure on the channels;
a first spacer on a sidewall of the gate structure, the first spacer comprising:
a central portion overlapping the channels in the vertical direction; and
a protrusion portion protruding from the central portion in a second direction substantially parallel to the upper surface of the substrate and substantially perpendicular to the first direction, the protrusion portion not overlapping the channels in the vertical direction, wherein the central portion is longer than the protrusion portion in the first direction and in the second direction; and
a source/drain layer on sidewalls of the channels, the source/drain layer contacting a sidewall of the central portion of the first spacer,
wherein the gate structure and the source/drain layer are spaced apart and electrically insulated from each other in the first direction by the first spacer, and
wherein a central portion in the first direction of a lower surface of the source/drain layer is lower than an edge portion in the first direction of the lower surface of the source/drain layer.

8. The semiconductor device of claim 7,
wherein the protrusion portion of the first spacer comprises first and second protrusion portions that protrude from opposite first and second ends, respectively, of the central portion of the first spacer in the second direction, and
wherein the first and second protrusion portions at the opposite first and second ends of the central portion of the first spacer are symmetric with each other.

9. The semiconductor device of claim 7, wherein the gate structure is on a central portion of each of the channels.

10. The semiconductor device of claim 7, wherein the source/drain layer contacts each of opposite sidewalls in the first direction of each of the channels.

11. The semiconductor device of claim 7, wherein the source/drain layer contacts an outer sidewall of the first spacer.

12. The semiconductor device of claim 7, wherein:
the first spacer is on each of opposite sidewalls in the first direction of a lower portion of the gate structure,
the semiconductor device further comprises a second spacer on each of opposite sidewalls in the first direction of an upper portion of the gate structure, and
the gate structure is electrically insulated from the source/drain layer by the first and second spacers.

13. The semiconductor device of claim 12, wherein the first and second spacers at least partially overlap with each other in the vertical direction.

14. A semiconductor device comprising:
a gate structure on a substrate, the gate structure including a lower portion and an upper portion sequentially stacked in a vertical direction;
channels spaced apart from each other in the vertical direction on an upper surface of the substrate, each of the channels extending through the lower portion of the gate structure in a first direction substantially parallel to the upper surface of the substrate, and the lower portion of the gate structure being at a height substantially equal to or lower than that of a top surface of an uppermost one of the channels;
a first spacer on each of opposite sidewalls in the first direction of the lower portion of the gate structure, the first spacer at least partially overlapping the upper portion of the gate structure in the vertical direction, and the first spacer comprising:
a central portion overlapping the channels in the vertical direction; and
a protrusion portion protruding from the central portion in a second direction, the protrusion portion not overlapping the channels in the vertical direction, wherein the central portion is longer in the second direction than the protrusion portion, the second direction being substantially parallel to the upper surface of the substrate and substantially perpendicular to the first direction;
a second spacer on each of opposite sidewalls in the first direction of the upper portion of the gate structure; and
a source/drain layer contacting each of opposite sidewalls in the first direction of the channels and each of opposite sidewalls in the first direction of the central portion of the first spacer,
wherein a central portion in the first direction of a lower surface of the source/drain layer is lower than an edge portion in the first direction of the lower surface of the source/drain layer.

15. The semiconductor device of claim 14, wherein the first spacer is between ones of the channels that neighbor each other in the vertical direction, and is between the substrate and one of the channels closest to the substrate.

16. The semiconductor device of claim 14,
wherein the protrusion portion of the first spacer comprises first and second protrusion portions that protrude from opposite first and second ends, respectively, in the second direction of the central portion of the first spacer, and
wherein the first and second protrusion portions at the opposite first and second ends of the central portion of the first spacer are symmetric with each other.

17. The semiconductor device of claim 14, wherein a width of each of the channels in the first direction is wider than a width of the gate structure in the first direction.

18. The semiconductor device of claim 14, wherein the first and second spacers at least partially overlap with each other in the vertical direction.

19. The semiconductor device of claim 14,
wherein the gate structure extends in the second direction, and
wherein the source/drain layer and the gate structure are spaced apart from each other in the first direction.

20. The semiconductor device of claim 19, wherein the central portion of the first spacer comprises a sloped sidewall that is between the gate structure and the source/drain layer.

* * * * *